(12) United States Patent
Miller et al.

(10) Patent No.: US 11,322,916 B2
(45) Date of Patent: May 3, 2022

(54) SOLID-STATE CIRCUIT BREAKER WITH GALVANIC ISOLATION

(71) Applicant: Atom Power, Inc., Charlotte, NC (US)

(72) Inventors: Frederick Miller, Charlotte, NC (US); Taylor Santore, Charlotte, NC (US); Denis Kouroussis, Markham (CA); Ryan Kennedy, Cornelius, NC (US)

(73) Assignee: Atom Power, Inc., Huntersville, NC (US)

( * ) Notice: Subject to any disclaimer, the term of this patent is extended or adjusted under 35 U.S.C. 154(b) by 110 days.

(21) Appl. No.: 16/898,538

(22) Filed: Jun. 11, 2020

(65) Prior Publication Data

US 2020/0395748 A1 Dec. 17, 2020

Related U.S. Application Data

(60) Provisional application No. 62/860,916, filed on Jun. 13, 2019, provisional application No. 62/860,913, filed on Jun. 13, 2019.

(51) Int. Cl.
*H02B 1/04* (2006.01)
*H02B 1/56* (2006.01)
(Continued)

(52) U.S. Cl.
CPC ............ *H02B 1/04* (2013.01); *H02B 1/56* (2013.01); *H02H 1/0007* (2013.01); *H02H 3/08* (2013.01);
(Continued)

(58) Field of Classification Search
CPC ............ G01R 15/202; G01R 19/175; G01R 19/2513; G01R 31/2827; G01R 31/3333;
(Continued)

(56) References Cited

U.S. PATENT DOCUMENTS 3,629,747 A * 12/1971 Findley, Jr. ........ H01H 71/2463
335/174
4,316,256 A 2/1982 Hendricks et al.
(Continued)

FOREIGN PATENT DOCUMENTS

| CN | 1375923 A | 10/2002 |
| CN | 1558248 A | 12/2004 |
| EP | 3041101 A1 | 7/2016 |

OTHER PUBLICATIONS

ANV SSR Series "Solid State Relay"; p. 1-12. [retrieved on Apr. 20, 2014], Retrieved from the Internet: <https://datasheetspdf.com/pdf-file/789345/ANV/SSR-80DA/1> (Year: 2014).*
(Continued)

*Primary Examiner* — Jared Fureman
*Assistant Examiner* — Nicolas Bellido
(74) *Attorney, Agent, or Firm* — Patent Law Professionals, P.C.; William E. Winters

(57) ABSTRACT

A solid-state circuit breaker (SSCB) with galvanic isolation capability includes an electrical bus with line-side and load-side terminals and a solid-state device connected in series with a closeable air gap between the line-side and load-side terminals. During normal operating conditions, the solid-state device is switched ON and the SSCB forces movable contacts inside the SSCB to close the air gap, so that an electrical current path is maintained between the line-side and load-side terminals and electrical current is allowed to flow through the SSCB and an attached load. Upon a short circuit or overload of unacceptably long duration occurring in the load circuit, the SSCB switches the solid-state device OFF to prevent current from flowing through the load, and releases the movable contacts to open the air gap and thereby establish galvanic isolation between the line-side and load side terminals.

38 Claims, 14 Drawing Sheets

(51) Int. Cl.
  *H05K 7/20* (2006.01)
  *H05K 5/00* (2006.01)
  *H02H 1/00* (2006.01)
  *H02H 3/08* (2006.01)
  *H03K 17/56* (2006.01)

(52) U.S. Cl.
  CPC ........... *H03K 17/56* (2013.01); *H05K 5/0017* (2013.01); *H05K 7/2039* (2013.01); *H05K 7/20172* (2013.01)

(58) Field of Classification Search
  CPC .. G01R 31/52; G01R 33/0023; G01R 33/072; H01H 2009/543; H01H 2009/546; H01H 2300/03; H01H 33/593; H01H 71/04; H01H 71/1009; H01H 71/1081; H01H 71/123; H01H 71/128; H01H 71/24; H01H 71/2463; H01H 71/58; H01H 89/00; H01H 9/54; H01H 9/542; H01H 9/548; H01H 9/56; H01H 9/563; H01L 29/1602; H01L 29/1608; H01L 29/2003; H01L 29/7802; H02B 1/04; H02B 1/056; H02B 1/56; H02B 1/565; H02H 1/0007; H02H 1/0061; H02H 1/0092; H02H 3/021; H02H 3/025; H02H 3/044; H02H 3/05; H02H 3/06; H02H 3/08; H02H 3/083; H02H 3/085; H02H 3/087; H02H 3/093; H02H 3/0935; H02H 3/165; H02H 3/167; H02H 3/20; H02H 3/33; H02H 3/38; H02H 3/382; H02H 3/42; H02H 3/445; H02H 5/044; H02H 5/048; H02H 7/005; H02H 7/008; H02H 7/0833; H02H 7/0855; H02H 7/0856; H02H 7/22; H02H 7/222; H02H 7/26; H02H 7/30; H02H 9/02; H02M 1/0009; H02M 1/0064; H02M 1/08; H02M 1/083; H02M 1/096; H02M 1/32; H02M 7/06; H02M 7/217; H02P 1/26; H03K 17/56; H05K 5/0017; H05K 7/20172; H05K 7/2039
  See application file for complete search history.

(56) References Cited

U.S. PATENT DOCUMENTS

| | | | |
|---|---|---|---|
| 4,644,438 A | 2/1987 | Puccinelli et al. | |
| D288,921 S | 3/1987 | Peck | |
| D305,019 S | 12/1989 | Pena et al. | |
| 5,132,865 A | 7/1992 | Mertz et al. | |
| D331,063 S | 11/1992 | Pasierb | |
| D334,542 S | 4/1993 | Lowe et al. | |
| D351,861 S | 10/1994 | Anderson et al. | |
| 5,502,286 A | 3/1996 | Pollman et al. | |
| 5,638,038 A | 6/1997 | Suzuki et al. | |
| D393,808 S | 4/1998 | Lindsey et al. | |
| 5,782,341 A | 7/1998 | Calder et al. | |
| 6,008,971 A | 12/1999 | Duba et al. | |
| D435,021 S | 12/2000 | Davis et al. | |
| D443,586 S | 6/2001 | Sakasegawa | |
| D443,595 S | 6/2001 | Pawley | |
| 6,887,084 B2* | 5/2005 | Saito .................... | H01H 85/044 337/290 |
| 7,453,678 B2* | 11/2008 | Beneditz ................ | G06F 1/305 361/93.2 |
| 8,582,265 B2 | 11/2013 | Britz | |
| D695,234 S | 12/2013 | Santiago et al. | |
| D697,033 S | 1/2014 | Hashimoto et al. | |
| 8,861,162 B2 | 10/2014 | Fuller et al. | |
| 9,287,065 B1 | 3/2016 | Davis et al. | |
| D754,615 S | 4/2016 | Chen et al. | |
| D768,582 S | 10/2016 | Jacoby et al. | |
| D784,168 S | 4/2017 | Jacoby et al. | |
| 10,134,551 B2 | 11/2018 | Potter et al. | |
| 10,276,321 B2* | 4/2019 | Kennedy ................ | H02H 7/261 |
| 10,541,530 B2 | 1/2020 | Kennedy et al. | |
| 2001/0026185 A1 | 10/2001 | Sher | |
| 2002/0093774 A1 | 7/2002 | Chung | |
| 2004/0113804 A1 | 6/2004 | Cabrera et al. | |
| 2007/0121257 A1 | 5/2007 | Maitra et al. | |
| 2009/0290275 A1 | 11/2009 | Staszesky et al. | |
| 2010/0118458 A1 | 5/2010 | Coffey | |
| 2010/0232082 A1 | 9/2010 | Seger | |
| 2011/0026185 A1 | 2/2011 | Boudet et al. | |
| 2011/0080677 A1 | 4/2011 | Radosavljevic et al. | |
| 2011/0102052 A1 | 5/2011 | Billingsley et al. | |
| 2011/0149483 A1 | 6/2011 | Diaz et al. | |
| 2011/0222200 A1 | 9/2011 | Fuller et al. | |
| 2011/0292556 A1 | 12/2011 | Britz | |
| 2012/0085520 A1* | 4/2012 | Pfaffinger ............. | H01L 23/427 165/104.26 |
| 2012/0218676 A1 | 8/2012 | Demetriades et al. | |
| 2013/0027829 A1 | 1/2013 | Antoniazzi et al. | |
| 2014/0029153 A1 | 1/2014 | Besana et al. | |
| 2015/0084420 A1 | 3/2015 | Dickerson et al. | |
| 2015/0236502 A1 | 8/2015 | Xu et al. | |
| 2015/0348722 A1 | 12/2015 | Fraser et al. | |
| 2016/0197465 A1 | 7/2016 | Poulose et al. | |
| 2016/0243951 A1 | 8/2016 | Pritelli et al. | |
| 2016/0294179 A1 | 10/2016 | Kennedy et al. | |
| 2016/0322802 A1 | 11/2016 | Coffey et al. | |
| 2017/0004948 A1 | 1/2017 | Leyh | |
| 2017/0063051 A1 | 3/2017 | Sharp | |
| 2017/0069441 A1 | 3/2017 | Mishrikey et al. | |
| 2017/0256934 A1* | 9/2017 | Kennedy ................. | H02H 3/20 |
| 2018/0366936 A1 | 12/2018 | Kennedy et al. | |
| 2019/0103742 A1* | 4/2019 | Kennedy ................. | H02H 7/22 |
| 2019/0341213 A1* | 11/2019 | Kouroussis ............ | H02H 3/167 |
| 2020/0083699 A1* | 3/2020 | Kennedy ................. | H02H 7/222 |
| 2020/0365346 A1 | 11/2020 | Telefus et al. | |
| 2020/0395739 A1* | 12/2020 | Santore ................... | H02H 3/08 |
| 2021/0066013 A1* | 3/2021 | Kumar ................ | G01R 33/0023 |
| 2021/0126447 A1* | 4/2021 | Miller .................... | H01H 71/58 |
| 2021/0241989 A1* | 8/2021 | Kouroussis ........ | H01H 71/1009 |

OTHER PUBLICATIONS

International Search Report (ISR) and Written Opinion (WO) from PCT/US20/49018.
International Search Report (ISR) and Written Opinion (WO) from PCT/US20/037158 (REF1).
International Search Report (ISR) and Written Opinion (WO) from PCT/US20/037163 (REF2).
The Telegraphic Journal and Electrical Review, June 6, 1885, vol. XVI, No. 393, (1884), Abstracts of Published Specifications, p. 520, paragraph 9115, H. Alabaster, gatehouse & Co., London.
International Search Report (ISR) and Written Opinion (WO) from PCT/US20/37158.
International Search Report (ISR) and Written Opinion (WO) from PCT/US20/37163.
P. Meckler, "Does and Electronic Circuit Breaker need Electrical Contacts?", Proceedings of the 50th IEEE Holm Conference on Electrical Contacts and The 22nd International Conference on Electrical Contacts, pp. 480-487, 2004.
Senior Design Team Works with Atom Power to Design Revolutionary Circuit Breaker, dated Jan. 29, 2016, [online], [site visited Aug. 1, 2017], Available from Internet <URL: https://isl.uncc.edu/news/2016-01-29/senior-design-team-works-atom-power-design-revolutionary-circuit-breaker>.
Eaton's New Narrow Frame Power And Air Circuit Breaker Offers Reduced Size And Improved Safety, dated Jun. 23, 2009, [online], [site visited Mar. 4, 2018]. Available from Internet, <URL: https://www.eaton.com/Eaton/OurCompany/NewsEvents/NewsReleases/CT_238199>.
Dual On/Off Push Button, dated Apr. 26, 2014, [online], [site visited Aug. 1, 2017]. Available from Internet, <URL: http://www.signaworks.com/products/industrial-push-buttons/dual-on/off-push-button.html>.

(56) References Cited

OTHER PUBLICATIONS

Function and rated characteristics of circuit breaker—all things need to know of circuit breaker, dated Oct. 20, 2013, [online], [site visited Mar. 4, 2018]. Available from Internet, <URL: http://eblogbd.com/details-characteristics-circuit-breaker/>.
Schneider Electric, "I-Line Busway" dated Jun. 10, 2019, [online], [site visited Jun. 10, 2019], https://www.schneider-electric.us/en/product-range-download/7550-i-line-busway/%23tabs-top.
J. Kiedaisch, "How the World's First Digital Circuit Breaker Could Completely Change the Powered World," Popular Mechanics, May 22, 2019. Available from Internet: <URL: https://www.popularmechanics.com/technology/infrastructure/a27557804/digital-circuit-breaker/>.
Nov. 21, 2021 Office Action from U.S. Appl. No. 16/898,569.

\* cited by examiner

SOLID-STATE CIRCUIT BREAKER WITH GALVANIC ISOLATION

CROSS-REFERENCE TO RELATED APPLICATIONS

This application claims the benefit of U.S. Provisional Patent Application No. 62/860,913, filed Jun. 13, 2019, and U.S. Provisional Patent Application No. 62/860,916, filed Jun. 13, 2019.

BACKGROUND OF THE INVENTION

Circuit breakers are used in electrical distribution systems to protect electrical circuits and their loads from short circuits and overloads. Conventional circuit breakers are electromechanical in nature, typically including an electromagnet that operates to separate the breaker's contacts as quickly as possible when a short circuit occurs, and a thermally responsive bimetallic strip that separates the circuit breaker's contacts after an overload has persisted in the circuit for an unacceptably long duration time.

Although conventional circuit breakers have been in widespread use for many years, and are effective at isolating faults, one significant drawback they have is that they are slow to respond—typically requiring several milliseconds to respond to and isolate a fault. The slow reaction time is undesirable since it increases the risk of fire in the circuit's electrical wiring, damage to electrical equipment, and the possibility of arc flashes, which can melt and weld the contacts back together and, in some circumstances, even cause the circuit breaker to explode. To guard against these problems, conventional circuit breakers, especially those used in high-voltage environments, usually include some sort of arc-control apparatus, such as arc chutes that divide and cool the arcs, compressed air that blows out the arcs, oil-filled chambers that envelope the breaker's contacts, or jet chambers that blast vaporized oil through the arcs.

To overcome the various problems that plague conventional circuit breakers, efforts have been made in recent years to adapt high-power semiconductors (i.e., "solid-state" devices) for circuit breaker applications. Solid-state devices are attractive since they are capable of interrupting current flow in a matter of microseconds, compared to the several milliseconds it normally takes for a conventional circuit breaker to trip. The fast reaction time reduces the risk of fire and damage to electrical equipment and, if the solid-state devices are properly controlled, the possibility of arc flashes can be practically eliminated, thus obviating the need for large and bulky arc-control devices. The current-voltage characteristics of solid-state devices are also precise and vary little from one part to another, unlike conventional electromechanical circuit breakers, which, due to their thermal, magnetic and mechanical construction, exhibit wide variances in their time-current characteristics, even among breakers of the same type and rating provided by the same manufacturer.

Although solid-state devices offer a number of important advantages over conventional electromechanical-type switches, there are various technological and regulatory problems and challenges that must be addressed and overcome before they can be successfully utilized as a circuit breaker and before they can be lawfully deployed in any practical electrical distribution system. The present invention addresses and provides solutions to these challenges and problems.

BRIEF SUMMARY OF THE INVENTION

A solid-state circuit breaker (SSCB) with galvanic isolation capability includes an electrical bus with line-side and load-side terminals and a solid-state device connected in series with a closeable air gap between the line-side and load-side terminals. During normal operating conditions, the solid-state device is switched ON and the SSCB forces movable contacts inside the SSCB to close the air gap, so that an electrical current path is maintained between the line-side and load-side terminals and electrical current is allowed to flow through the SSCB and an attached load. Upon a short circuit or overload of unacceptably long duration occurring in the load circuit, the SSCB switches the solid-state device OFF to prevent current from flowing through the load, and releases the movable contacts to open the air gap and thereby establish galvanic isolation between the line-side and load side terminals.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 1A:
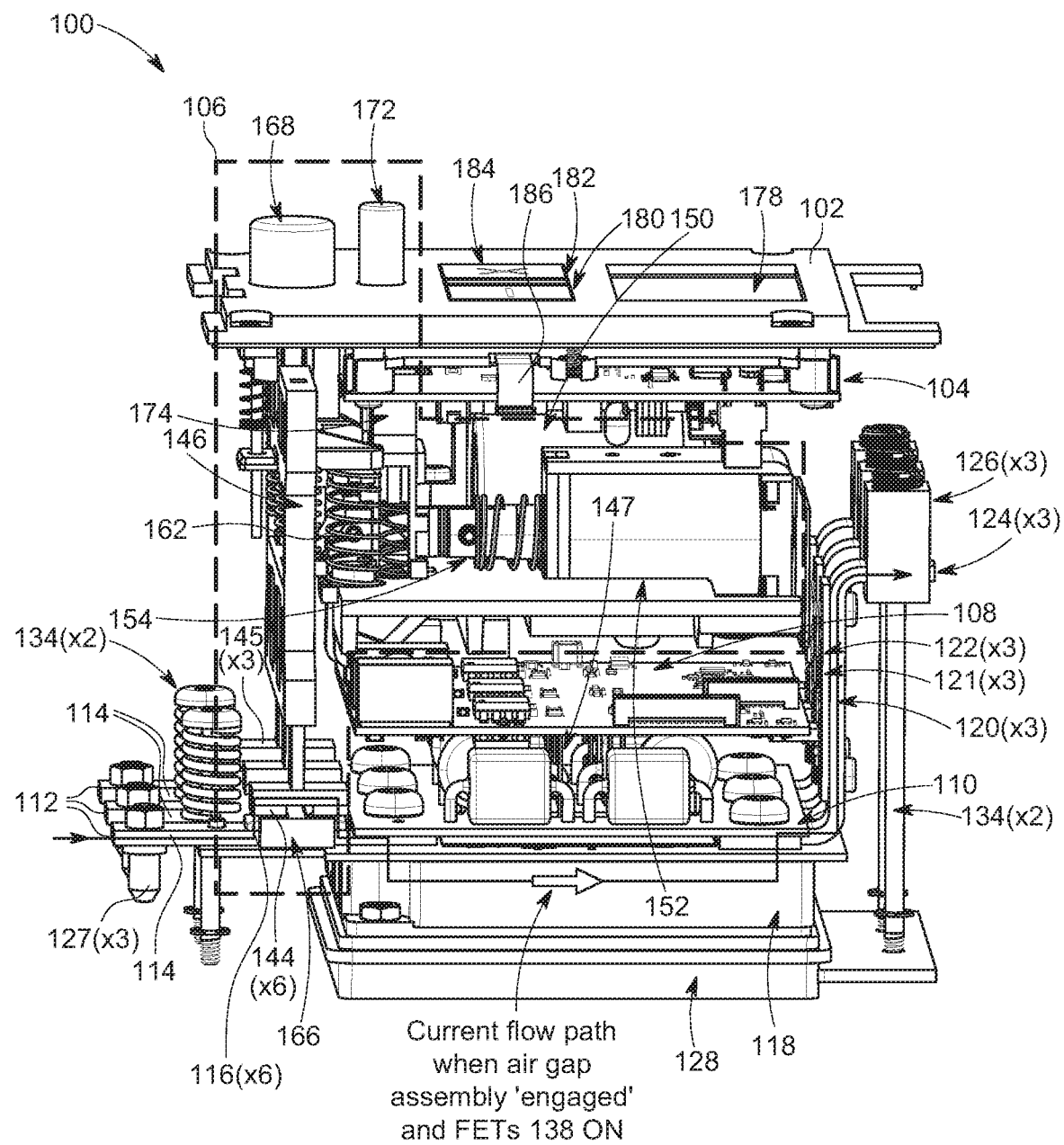
FIGS. 1A and 1B are side perspective view drawings of a solid-state circuit breaker (SSCB) with galvanic isolation capability, according to one embodiment of the present invention.
Figure 1B:
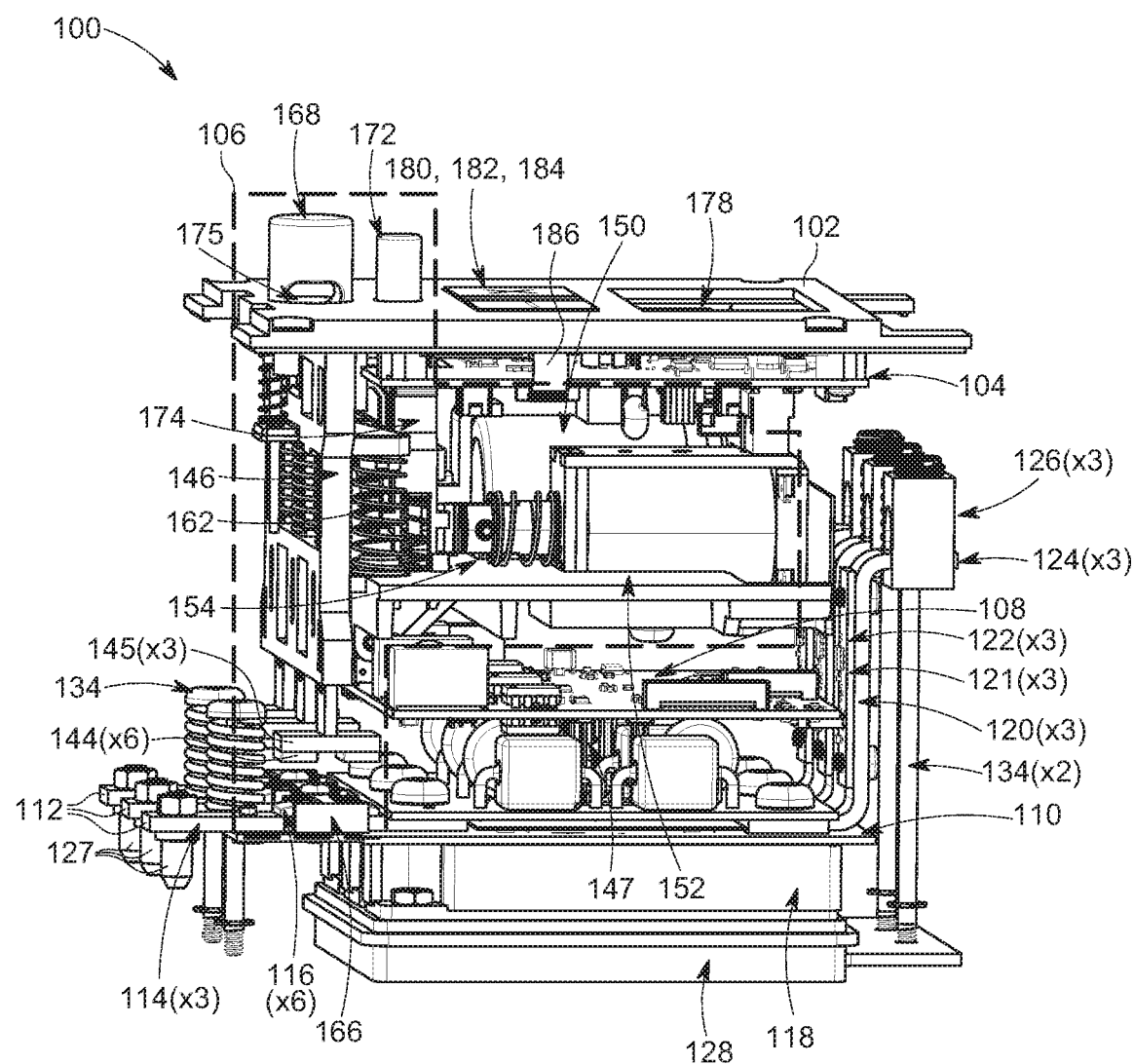
Figure 2:
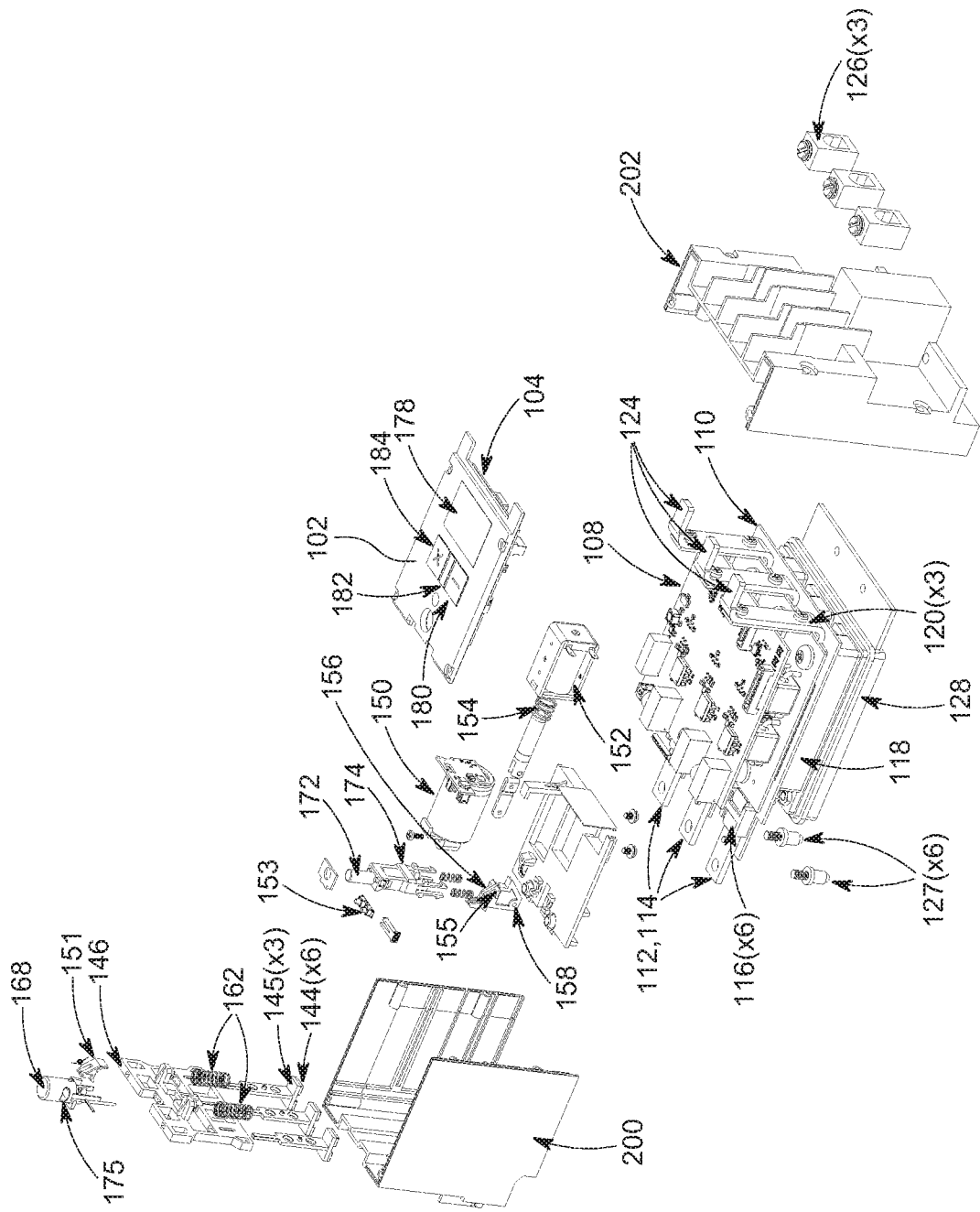
FIG. 2 is an exploded view drawing of the SSCB depicted in FIGS. 1A and 1B.

Referring to FIGS. 1A-B and 2, there are shown perspective views (FIGS. 1A and 1B) and an exploded view (FIG. 2) of a solid-state circuit breaker (SSCB) 100, according to one embodiment of the present invention. The salient components of the SSCB 100 include: front faceplate 102; control board 104; mechanical air gap assembly 106; driver board 108; surge protection board 110; line-in (i.e., line-side) terminals 112; copper bus 114; bridge contacts 116; FET (field-effect transistor) power module 118; S-bends 120; current sense boards 122; line-out (i.e., load-side) terminals 124; load connection lugs 126; and thermally conductive heat spreader 128. Note that the exemplary embodiment of the SSCB 100 depicted here is a three-phase device. Accordingly, there are three line-in terminals 112, three copper transmission lines in copper bus 114, three bridges 145 with six bridge contacts 116 (two contacts 116 per bridge 145), three solid-state-device current flow paths through FET power module 118, three S-bends 120, three current sense boards 122, three line-out terminals 124, and three load-side connection lugs 126. A single-phase version of the SSCB would have just a single one of each of these and possibly other components, as will be appreciated and understood by those of ordinary skill in the art. Also note that FIGS. 1A and 1B depict the SSCB 100 with the air gap assembly 106 'engaged' and 'disengaged,' respectively. A detailed description of these two states and a detailed description of how the air gap assembly 106 operates are provided below.

Figure 3:
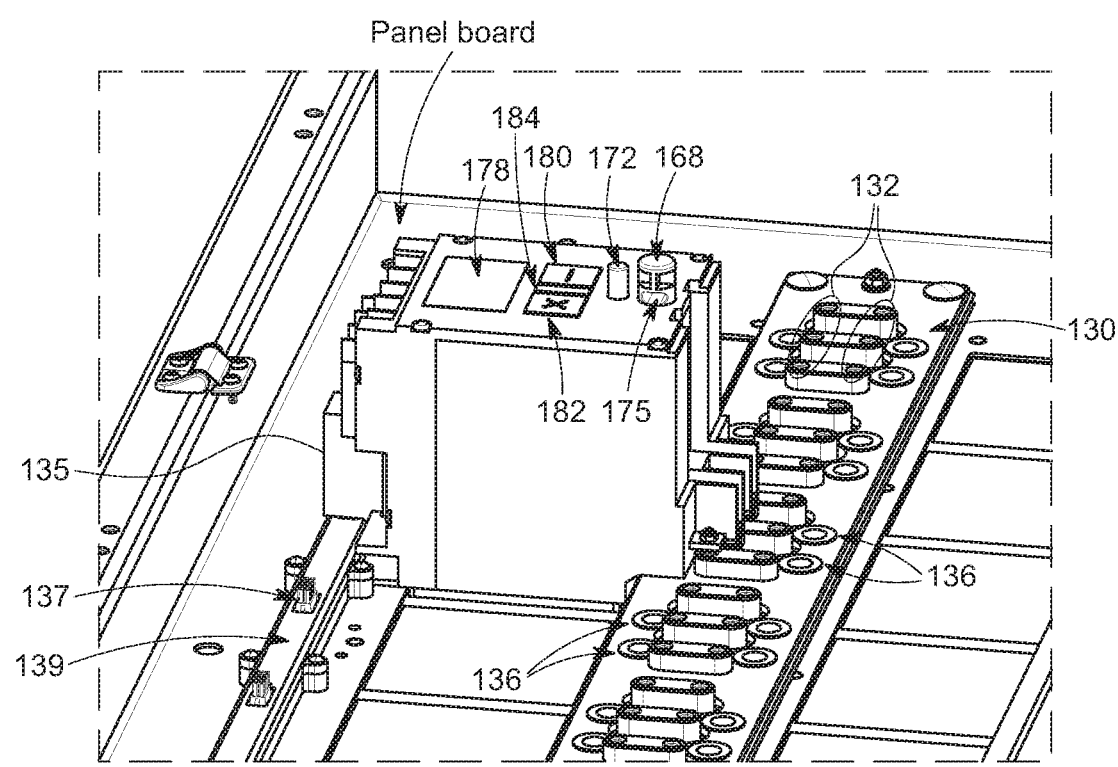
FIG. 3 is a perspective view drawing illustrating how, in accordance with one embodiment of the invention, the line-side terminals of the SSCB depicted in FIGS. 1A, 1B and 2 are configured to connect to a 'stacked' busbar in an electrical distribution panel, how press-fit mounting pins on the line-side terminals fit into matching press-fit mounting receptacles in the stacked busbar, and how the SSCB connects to a communications and control (comm/control) bus in the distribution panel.
Figure 4:
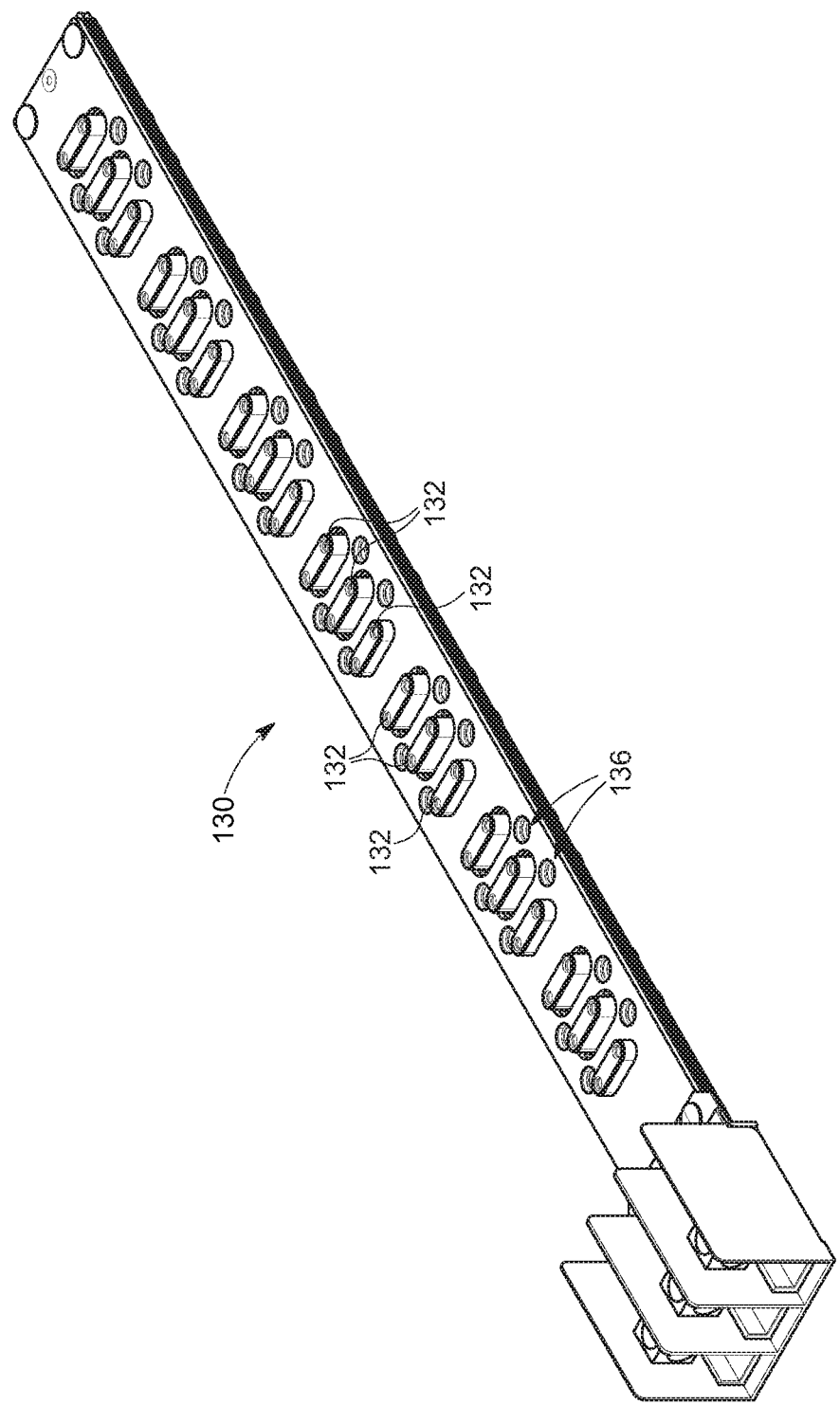
FIG. 4 is an expanded perspective view drawing of the busbar partially depicted in FIG. 3.

The SSCB 100 is designed so that its line-in terminals 112 can easily connect to a three-phase "hot" busbar in a panelboard (i.e., distribution panel). In one embodiment of the invention (depicted in FIGS. 1A, 1B and 2) line-in terminals 112 include electrically conductive press-fit mounting/connection pins 127 that insert into matching pin-mount receptacles 132 in busbar 130, as illustrated in FIG. 3. Busbar 130, which can be seen more fully in the expanded perspective view in FIG. 4, includes three electrically conductive (e.g., copper) layers (or 'bars') stacked one over the other with electrically insulating layers in between. By stacking the various layers, the space and area that the busbar 130 and SSCB 100 (and other SSCBs) occupy in the panelboard is minimized. Note that each of the pin-mount receptacles 132 has a conductive surface or sleeve that electrically connects to one of the stacked bars (i.e., to one of the conductive layers in the stack) and is sized to mate with (i.e., receive) one of the corresponding electrically conductive press-fit connection pins 127 of SSCB 100. When the SSCB 100 is mounted in the panelboard, a power cable can be connected and routed from a load to connection lugs 126 of line-out terminals 124.

Figure 5:
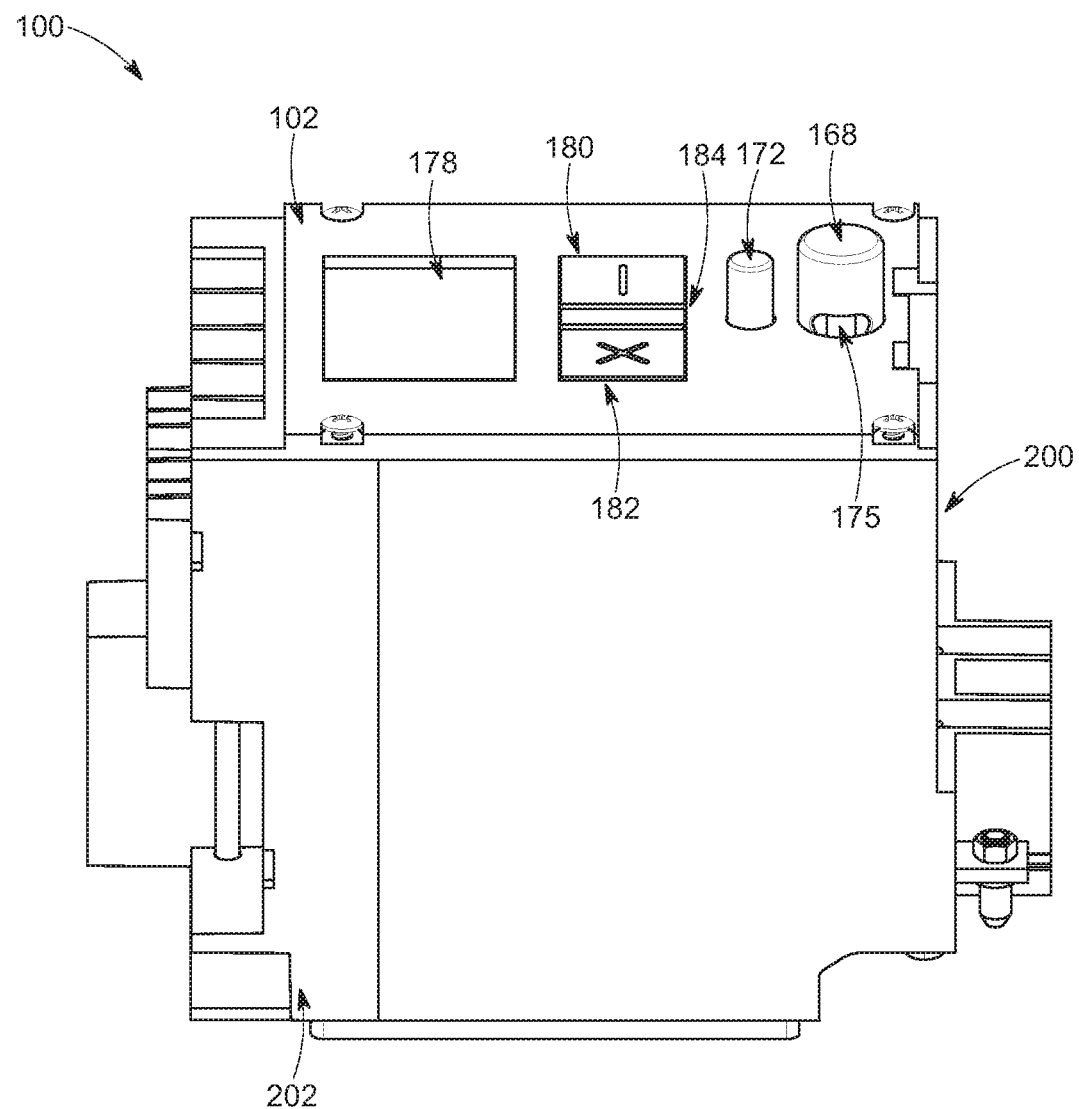
FIG. 5 is a perspective view drawing illustrating how the SSCB depicted in FIGS. 1A and 1B can be housed within an enclosure having a front faceplate with cutouts that reveal and provide access to an electronic display, ON/OFF/STANDBY buttons/indicators, a RELEASE button, and a RESET button.
Figure 6:
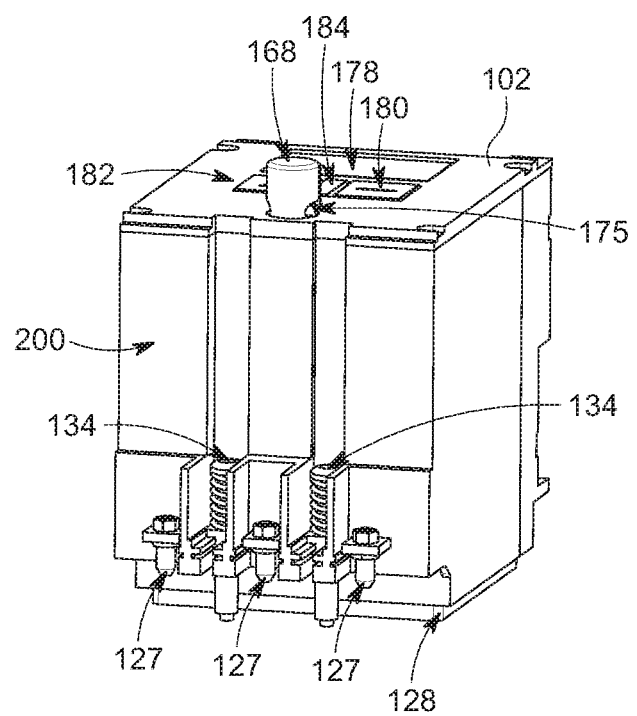
FIG. 6 is a line-side perspective view drawing of the housed SSCB depicted in FIG. 5, highlighting the press-fit mounting pins that insert into a busbar in a distribution panel and spring-loaded screws used to mount a thermally conductive heatspreader of the SSCB to a panelboard heatsink, according to one embodiment of the present invention.
Figure 7:
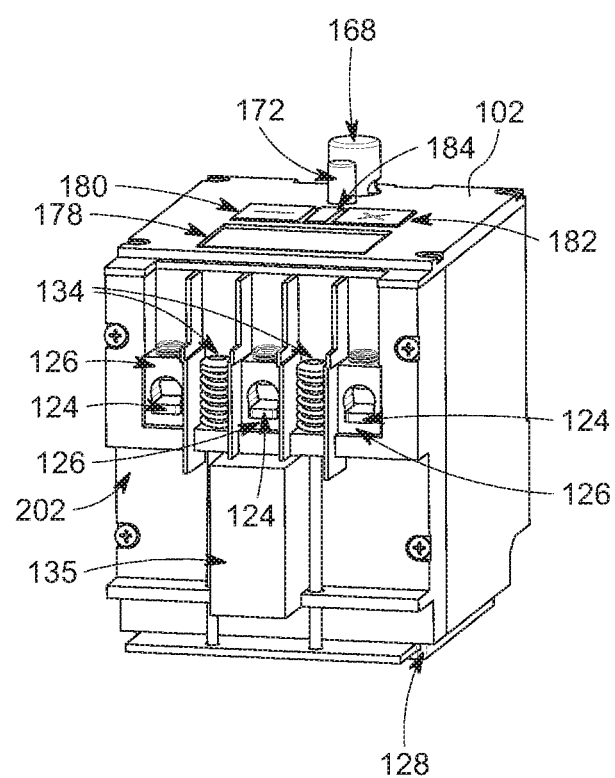
FIG. 7 is a load-side perspective view drawing of the housed SSCB depicted in FIG. 5, highlighting load-side connection lugs for attaching to a load, spring-loaded screws for mounting the thermally conductive heatspreader of the SSCB to the panelboard heatsink, and a comm/control bus connector that connects to a comm/control bus within the distribution panel.

Preferably the SSCB 100 is enclosed within a housing (i.e., an 'enclosure'), as illustrated in FIGS. 5-7. FIG. 7, which is a load-side perspective view of the enclosed SSCB 100, reveals the load-side connection lugs 126. It also reveals a communications and control (comm/control) bus shield 135 that protects an electrical comm/control bus connector (not shown) that is in electrical communication with the SSCB's 100's control board 104 (e.g., by way of a wiring harness). The comm/control bus connector is designed so that it can be connected to one of matching comm/control bus connectors 137 configured along comm/control bus 139 in the panelboard (see FIG. 3). Comm/control bus 139 provides the SSCB 100 the ability to communicate with, and to be controlled by, a local or remote computer, similar to as described in commonly assigned U.S. Pat. No. 10,541,530, entitled "Hybrid Air-Gap/Solid-State Circuit Breaker," and commonly assigned U.S. Pat. No. 10,276,321, entitled "Dynamic Coordination of Protection Devices in Electrical Distribution Systems," both which are incorporated herein by reference. Comm/control bus 139, which may be an inter-IC (I2C) or controller area network (CAN) bus, for example, further allows the local or remote computer to, among other things: program and direct the control and operation of a microcontroller 148 on the SSCB's 100's control board 104; individually assign a unique electronic address and/or other electronic identifier to the SSCB 100 (thereby allowing the exact physical location of the SSCB 100 in the panelboard to be known or ascertained); determine the trip and operational status of the SSCB 100 (e.g., ON, OFF, or STANDBY); command the SSCB 100 to disengage mechanical air gap assembly 106; command the SSCB 100 to switch FETs in FET power module 118 ON and OFF; test, monitor, and/or log both real time and non-real-time operating characteristics of the SSCB 100 (e.g., real time line currents, line-in and line-out voltages, FET power module 118 operating temperature, etc.); diagnose performance related problems the SSCB 100 may experience or encounter; set, manipulate, and allow a person (e.g., an electrician or engineer) to manually set and alter the SSCB's 100's trip settings; and allow a person to define, change and control what information is being displayed on the SSCB's 100's electronic display 178. Note that the local or remote computer may be any type of computer, including a large mainframe computer, desktop computer, laptop computer, hand-held computer, tablet computer, smartphone, etc., and the comm/control bus 139 may comprise, include, and/or be configured to connect to and communicate over any one or more wired and/or wireless networks, including a local area network (LAN), wide area network (WAN), cellular network, Internet, etc.

Figure 16:
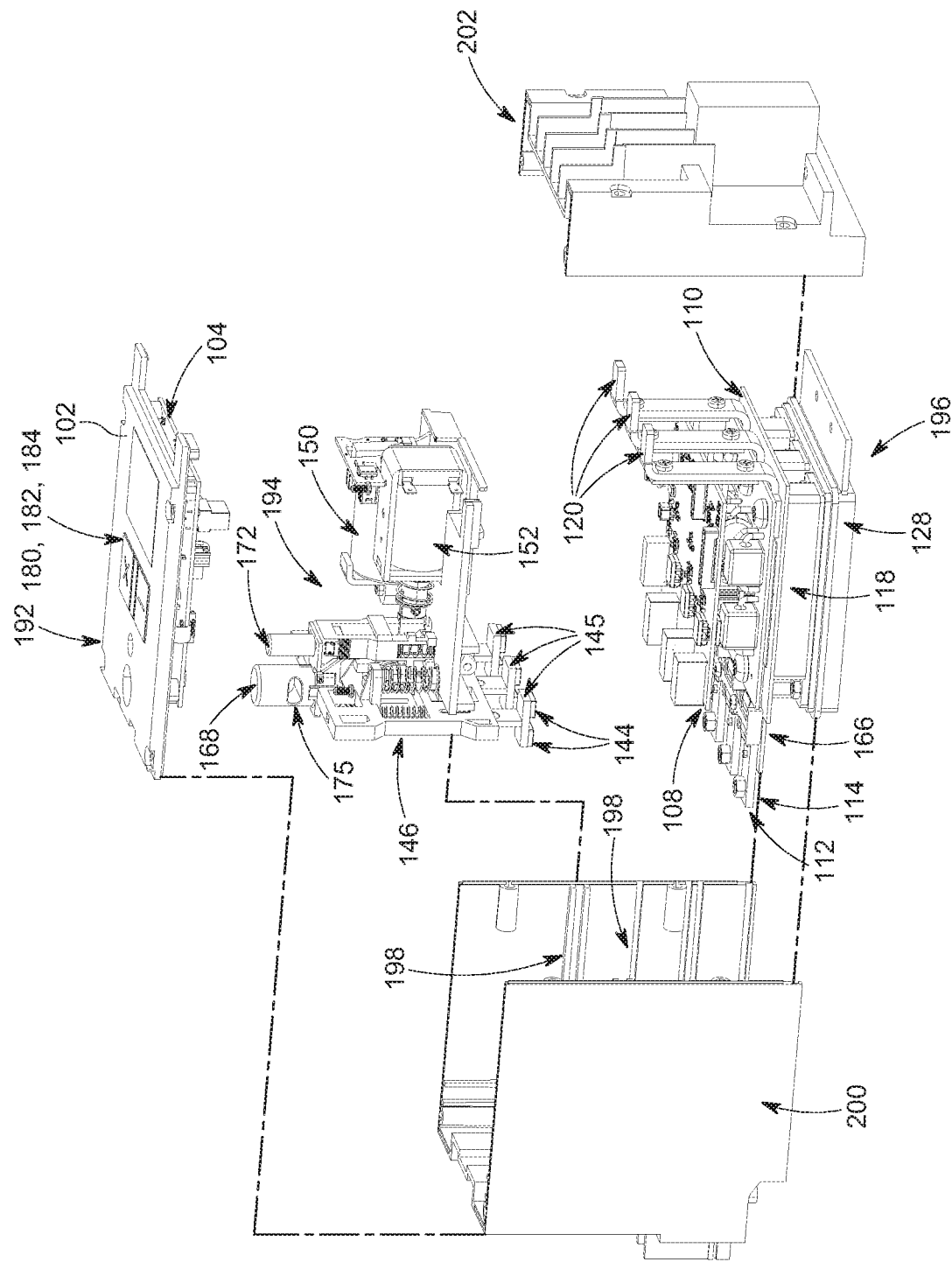
FIG. 16 is a drawing depicting how the SSCB in one embodiment of the present invention is constructed from just a few compact subassemblies that can be assembled quickly and reliably in only a small number of repeatable steps.

FIG. 6, which is a line-side perspective view of the enclosed SSCB 100, reveals the press-fit mounting pins 127 that insert into pin-mount receptacles 132 of busbar 130, to facilitate and simplify installation of the SSCB 100 in a panelboard. FIGS. 6 and 7 further illustrate how the SSCB's enclosure is equipped with (i.e., 'holds') four spring-loaded screws 134. Two of the spring-loaded screws 134 are held in load-side enclosure piece 202 (as shown in FIGS. 7 and 16) and the other two spring-loaded screws 134 are held in line-side enclosure piece 200 (as depicted in FIGS. 6 and 16). The four spring-loaded screws 134 are used to mount the SSCB 100 to a panelboard, and in one embodiment of the invention the SSCB's 100's thermally conductive heat spreader 128, which is preferably made of aluminum, is designed so that it can be mounted in direct physical contact with a large heatsink located at the back of the panelboard. So that this can be accomplished, a portion of the back wall of the panelboard is removed (e.g. cutout) so that the panelboard heatsink is exposed in the back of the panelboard. In this way the heatspreader 128 can serve not only as a heatsink for conducting heat away from FET power module 118 but also as a mounting plate (or 'block'). When mounted to the panelboard heatsink the SSCB's heat spreader 128 is sandwiched between and in direct physical contact with both the FET power module 118 and the panelboard heatsink. The portion of the panelboard heatsink that is exposed at the back of the panelboard has four tapped receiving holes for receiving the four spring-loaded screws 134 held in the SSCB's 100's line-side and load side enclosure pieces 200 and 202. (Note that the portion of the panelboard heatsink that is exposed at the back of the panelboard has four receiving holes for each SSCB that is installed in the panelboard.) In accordance with one embodiment of the invention, two thru-holes 136 are formed through busbar 130 (see FIGS. 3 and 4) and two more thru-holes are formed through or next to a rail that encloses comm/control bus rail 139, thereby allowing the SSCB's four spring-loaded screws 134 two pass through and screw into the four panelboard heatsink receiving holes. By forming two thru-holes through the busbar 130 on the SSCB's line side and two more thru-holes through or near the comm/control bus rail on the SSCB's load side, the volume of space that the SSCB 100 and other SSCBs in the panelboard occupy is minimized. Additionally, using the four spring-loaded screws 134, instead of screws without springs, ensures that the thermally conductive heat spreader 128 is pressed firm and flat against the panelboard heatsink. The springs in the spring-loaded screws 134 also prevent the screws from being overtightened. To enhance thermal conduction of heat away from the FET power module 118 and to the panelboard heatsink a thermal compound can be applied to one or both of the surfaces of the thermally conductive heat spreader 128 that are in direct physical contact with the FET power module 118 and panelboard heatsink. Alternatively, a thermal pad could be inserted between the SSCB's heat spreader 128 and the panelboard heatsink during the installation/mounting process. The SSCB's 100's spring-loaded screws 134, together with its press-fit mounting pins 127, thus ensure that the process of mounting the SSCB 100 (and other SSCBs of the same type) into the panelboard is easy, consistent, reliable, and repeatable.

It should be mentioned that whereas the SSCB 100 described in this disclosure is designed for installing/mounting in a panelboard, in another embodiment of the invention the SSCB comprises a single-breaker type enclosure that is not specifically designed for installing/mounting in a panelboard. In that alternative embodiment, the SSCB would not include all of the various design features that the exemplary SSCB 100 describer here has which allow it to be installed/mounted in a panelboard. For example, the single-breaker type enclosure would not necessarily include the press-fit mounting/connection pins 127 and would not necessarily include the spring-loaded screws 134 to mount the SSCB to a panelboard heatsink.

Figure 8:
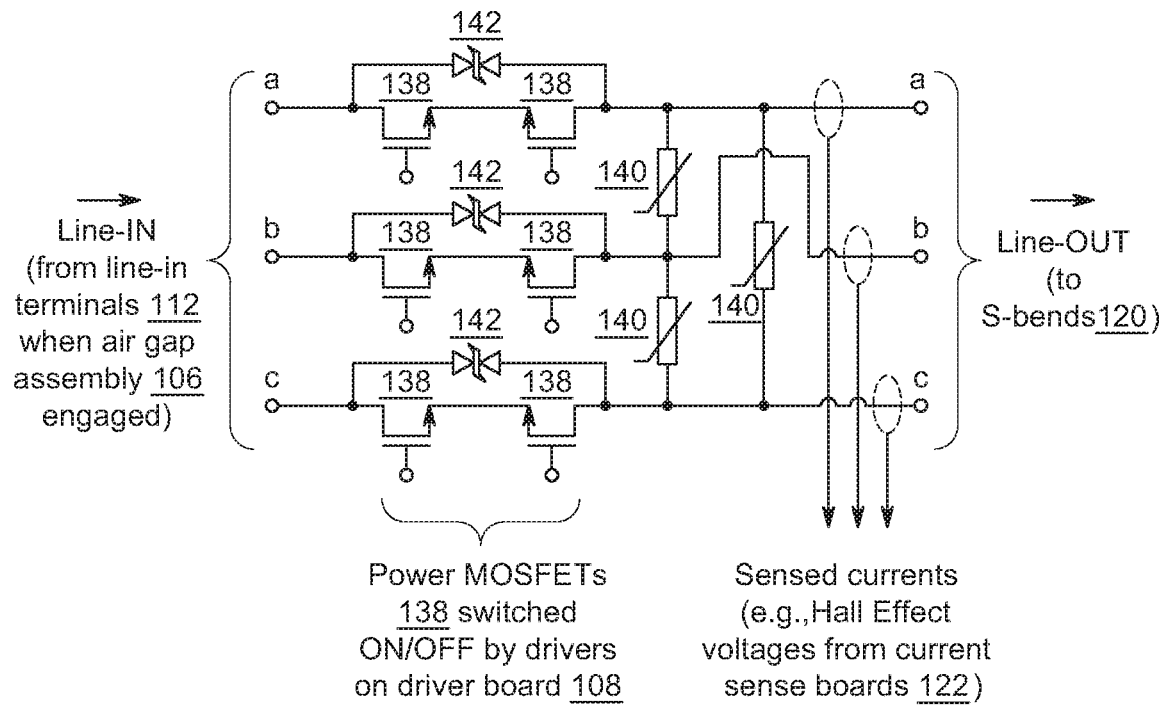
FIG. 8 is a schematic drawing of one implementation of the solid-state device deployed in the SSCB to allow or disrupt current flow through the SSCB and attached load, in accordance with one embodiment of the present invention.

The FET power module 118 comprises a plurality of solid-state devices that determine whether line currents directed into the line-in terminals 112 are able to pass (i.e., flow) to the load-side of the SSCB 100. FIG. 8 is a schematic drawing illustrating how the plurality of solid-state devices (a plurality of power metal-oxide-semiconductor field-effect transistors (MOSFETs) in this example) is configured in the FET power module 118. (Those of ordinary skill in the art will appreciate and understand that although MOSFETs are used in this exemplary embodiment, other types of solid-state devices (not necessarily FETs) can be alternatively used.) Each of the three phases includes a pair of back-to-back MOSFETs 138. The back-to-back MOSFET configuration is employed since it can be exploited to facilitate soft starting of inductive motor loads, similar to as explained in previously referred to copending and commonly assigned U.S. patent application Ser. No. 15/443,736. Insofar as the present invention is concerned, however, a single solid-state device in each phase would be sufficient to control current flow between the line-in side and line-out side of the SSCB 100. In the exemplary schematic depicted in FIG. 8, metal-oxide varistors (MOVs) 140 are connected between each pair of phases, preferably on the load side, and transient-voltage-suppression (TVS) diodes 142 are connected across each pair of MOSFETs 138 in each phase. (Note that in the exemplary embodiment of the SSCB 100 depicted in FIGS. 1A-B and 2, the TVS diodes 142 and MOVs 140 are mounted on a separate surge protection board 110, rather than on a circuit board in the FET power module 118, although they could be, alternatively, included on a circuit board in the FET power module 118.) Among other protective functions, TVS diodes 142 and MOVs 140 suppress voltage surges that occur during short circuit events as well as voltage spikes that can occur during a "current pulsing" technique that the SSCB 100 can be configured to perform in selectively coordinating it downstream from a mechanical circuit breaker, as discussed in copending and commonly assigned U.S. patent application Ser. No. 16/382,590, entitled "Selective Coordination of Solid-State Circuit Breakers and Mechanical Circuit Breakers in Electrical Distribution Systems," which is incorporated by reference.

Figure 9A:
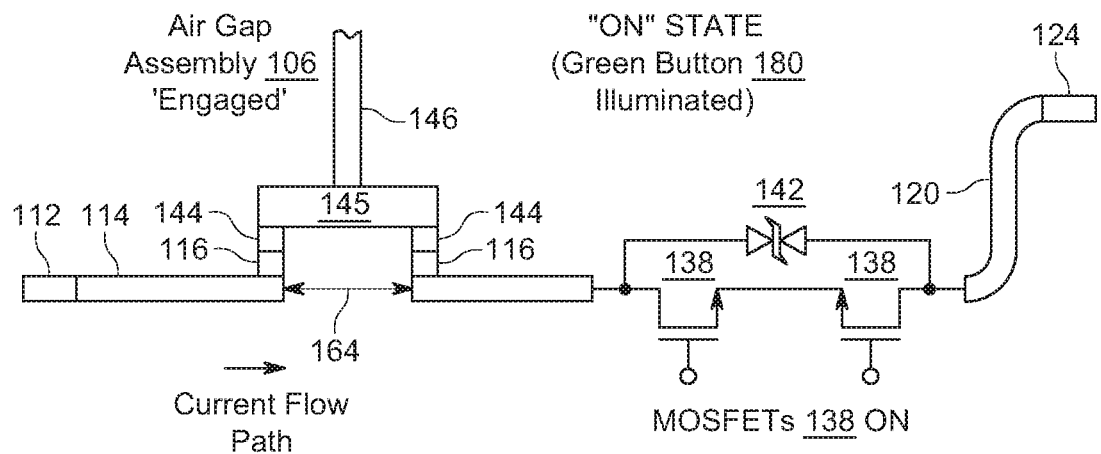
FIGS. 9A, 9B and 9C are drawings that illustrate how, according to one embodiment of the present invention, the SSCB depicted in FIGS. 1A, 1B and 2 is configurable to operate in an ON state, an OFF state, and a STANDBY state.

FIG. 9A is a drawing showing the current low path that one of the line currents follows between line-in terminals 112 and line-out terminals 124, when the SSCB 100 is configured in a closed circuit with a load connected to connection lugs 126 of line-out terminals 124. (Note that the MOSFETs 138 in FET power module 118 are ON when the SSCB 100 is in this 'state'.) As can be seen in the drawing, bridge contacts 144 at the distal end of a holster 146 of air gap assembly 106 (described in detail below) are in physical and electrical contact with corresponding bridge contacts 116 on copper bus 114 and input to the FET power module 118. (Note that there are three pairs each of bridge contacts 144 and bridge contacts 116. So there are a total of twelve contacts in this three-phase embodiment of the SSCB 100. See FIGS. 1A-B and 2.) As illustrated in FIG. 9A, line current entering line-in terminal 112 flows along copper bus 114, through a first pair of contacts 116/144, across conductive bridge 145 held by holster 146, through a second pair of contacts 116/144, through the drain-source paths of one pair of back-to-back MOSFETs 138 in the FET power module 118, through S-bend 120, and finally to line-out terminal 124. Notice that each S-bend 120 in the SSCB 100 includes a significant length of conductor that extends vertically upwards before bending back horizontal to line-out terminals 124. The vertically extending portions of S-bends 120 provide the necessary length and surface area for mounting current sense boards 122, which preferably include Hall effect sensors for measuring the line currents. (The current sense boards 122 can be seen in FIGS. 1A, 1B and 2.) The significant lengths of vertically extending portions of S-bends 120 also allow more accurate Hall effect readings to be taken, compared to if shorter length conductors were used. Finally, and importantly, the unique "S-shape" of S-bends 120 helps minimize the footprint and volume of space occupied by the SSCB 100.

The MOSFETs 138 in FET power module 118 are driven by drivers on the driver board 108 (see FIGS. 1A, 1B and 2). Drive signals generated on the driver board 108 are transmitted via feedthroughs 147 (see FIG. 1A) that extend from the bottom of the driver board 108, through surge protection board 110, and terminally to the gates of MOSFETs 138. Current sensors 121 (e.g., Hall effect sensors) on current sense boards 122 measure the line currents flowing along the line-current path just described. In one embodiment of the invention the driver board 108 includes current monitoring and detection circuitry (hardware) that monitors the line currents, based on the current measurements received from current sense boards 122. If the current monitoring and detection circuitry determines that any one of the line currents has risen to a level indicative of a short circuit (or impending short circuit), it generates gating disable signals to switch MOSFETs 138 in FET power module 118 OFF. In another embodiment of the invention, the current measurements taken by the current sense boards 122 are directed to microcontroller 148 on control board 104. According to this alternative software-centric approach, microcontroller 148 is programmed to determine, based on the current measurements it receives, whether any one of the line currents has risen to a level indicative of a short circuit or impending short circuit. If a short circuit or impending short circuit is determined to be present, microcontroller 148 commands drivers on driver board 108 to immediately switch MOSFET's 138 in FET power module 118 OFF.

Figure 10:
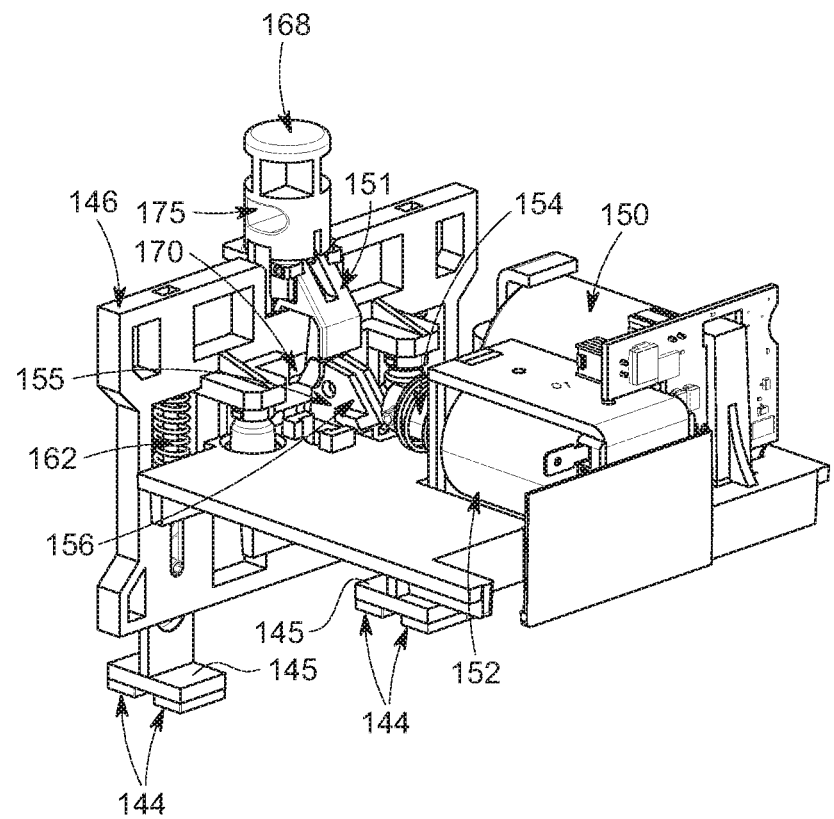
FIGS. 10 and 11 are perspective drawings showing the salient components of the air gap assembly of the SSCB depicted in FIGS. 1A, 1B and 2, according to one embodiment of the invention.
Figure 11:
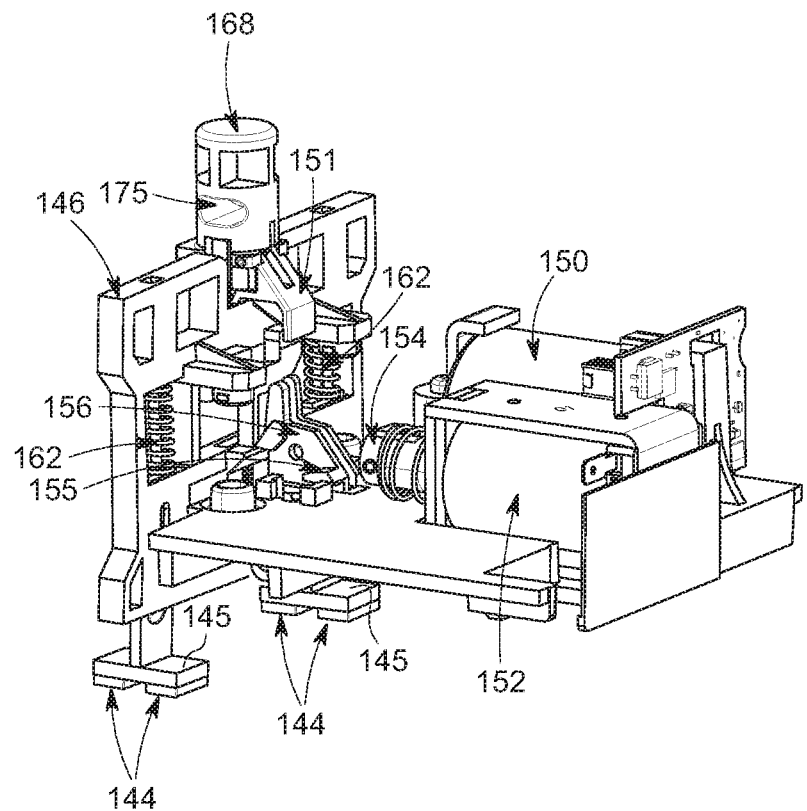
Figure 12:
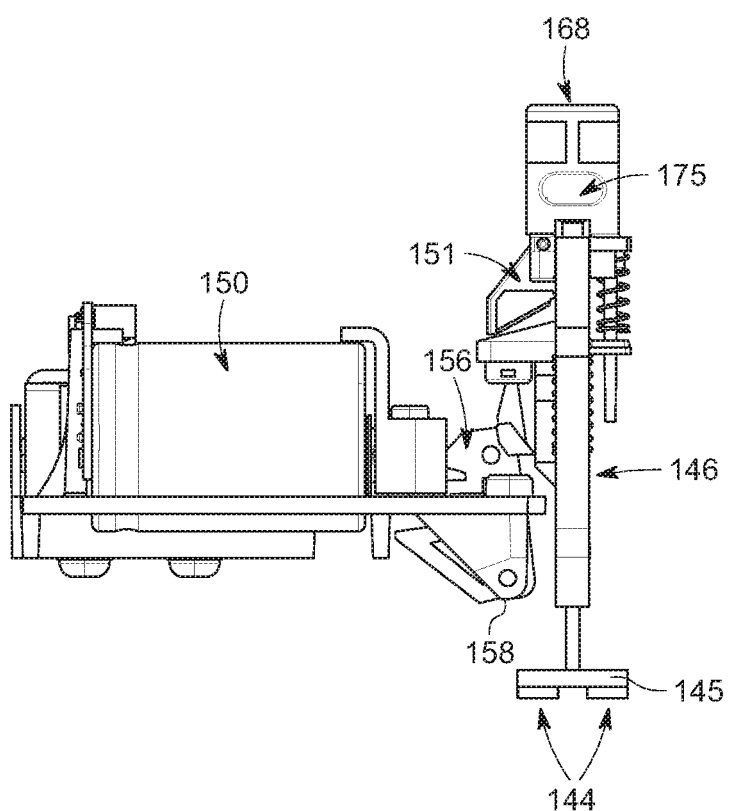
FIG. 12 is a side view drawing of a portion of the air gap assembly depicted in FIGS. 10 and 11.

In addition to having the ability to interrupt current flow by switching MOSFETs 138 OFF, the SSCB 100 also has the ability to intentionally form complete galvanic isolation between the line-in and line-out terminals 112 and 124. The FET power module 118 is fully capable by itself of stopping line currents from flowing. However, due to the fact that governmental, regulatory, and certification bodies usually require galvanic isolation to be present in a circuit breaker when the circuit breaker is in the "tripped" state, the SSCB 100 is equipped with mechanical air gap assembly 106, which when 'disengaged' forms an air gap (galvanic isolation) between copper bus 114 and input to the FET power module 118. As can be seen more clearly in FIGS. 10-12, among other things, air gap assembly 106 includes, a large (i.e., high capacitance, for example, 10,000 microfarads or higher) capacitor 150, solenoid 152, holster 146, rotating latch 156, disconnect springs 162, pawl 151, RESET button 168, and RELEASE button 172. As will be explained in detail below, air gap assembly 106 can be triggered to disengage automatically (by action of the solenoid 152), manually (without the assistance of the solenoid 152 but in response to a person pressing the RELEASE button 172), or in response to a command from a local or remote computer configured to interact with the SSCB 100 via comm/control bus 139. Automatic triggering occurs whenever a short circuit or other circuit anomaly (e.g., overload of unacceptably long duration) is detected in the SSCB's 100's load circuit, whether by circuitry on the driver board 108 (hardware approach) or by the microcontroller 148 on control board 104 (software-centric approach). During normal operating conditions, i.e., before any short circuit or other anomaly is detected, the solenoid's 152's plunger 154 is extended and rotating latch 156, which rotates about pivot 158, is positioned so that it holds holster 146 down. More specifically, as can be best seen in FIG. 10, when rotating latch 156 is in this 'latched' condition it engages a top lip 170 of holster 146, holding holster 146 down so that the air gap assembly 106 is 'engaged' and bridge contacts 144 on the bottom of conductive bridges 145 are in physical and electrical contact with corresponding bridge contacts 116 (as can be better seen in FIGS. 1A and 9A). However, upon an occurrence of a short circuit or unacceptably long overload, large capacitor 150 (which is configured so that it remains charged and on the ready during normal operating conditions) is switched across the coil of solenoid 152, for example, by closing a switch (not shown in the drawings) connected in series with the large capacitor 150 and coil. When the large charged capacitor 150 is switched across the solenoid's 152's coil, a significant current begins to flow through the coil, which in turn creates a magnetic field that causes solenoid 152 to pull its plunger (i.e., 'piston') 154 inside the solenoid housing. Rotating latch 156, which rotates about pivot 158 (see pivot 158 in FIG. 12), is connected to the distal end of the solenoid's 152's plunger (i.e., 'piston') 154. Accordingly, as solenoid 152 pulls its plunger 154 inside, rotating latch 156 rotates about pivot 158 causing it to swing away and release from top lip 170 of holster 146. With nothing now holding holster 146 down, normally-compressed disconnect springs 162 are then able to decompress and lift holster 146 up. Compare FIG. 10 to FIGS. 11 and 12, which show the rotating latch 156 in the latched (FIG. 10) and unlatched (FIGS. 11 and 12) position, respectively. When in the unlatched position (air gap assembly 106 disengaged and holster 146 in 'up' position) contacts 144 on the bottom of conductive bridges 145 are no longer in contact with matching bridge contacts 116 below (the state depicted in FIGS. 1B and 9B). Consequently, complete galvanic isolation (i.e., and 'air gap') is realized between line-in and line-out terminals 112 and 124. It should be mentioned that because the MOSFETs 138 in the FET power module 118 are switched OFF well before air gap assembly 106 is able to disengage and form the air gap, it is not possible for an arc flash to develop across the air gap. The need for large and bulky arc-control devices in the SSCB 100 is therefore completely avoided. It should also be mentioned that rotating latch 156 occupies less space than other types of hold and release mechanisms, for example hold/release mechanisms that move only in one linear direction, such as hold/release mechanisms that move only laterally (e.g., back and forth) in one plane. This aspect of the SSCB's 100's design therefore further helps minimize the footprint of the SSCB 100.

Figure 9B:
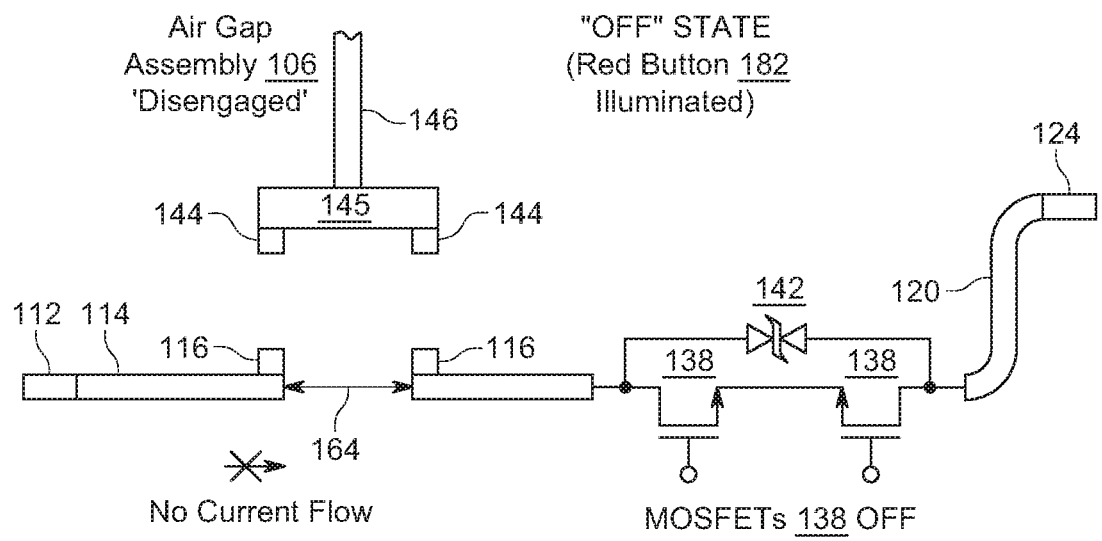
Figure 9C:
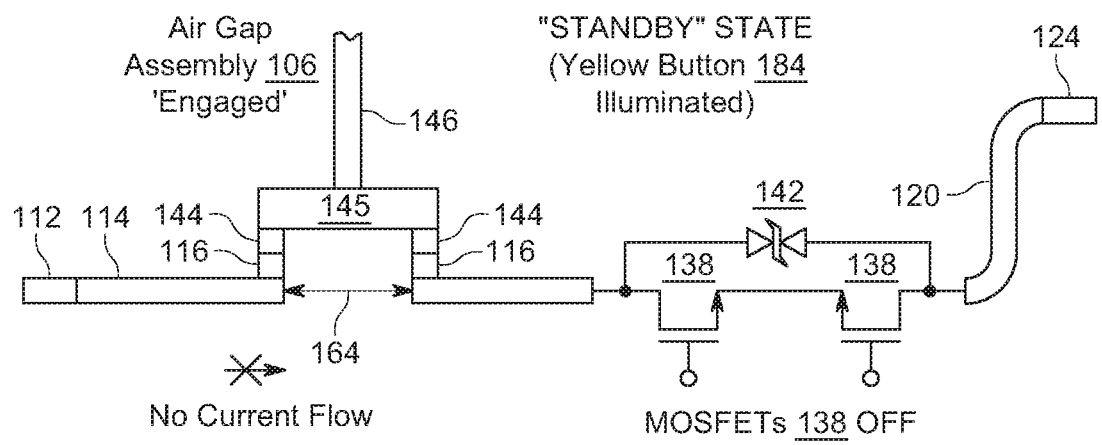

As indicated and illustrated in FIGS. 9A-C, there is a physical and ever-present gap 164 between the copper bus 114 and line-side inputs to the FET power module 118. In one embodiment of the invention, an electrically nonconductive plastic "barrier" 166 is inserted into this gap 164.

Figure 13:
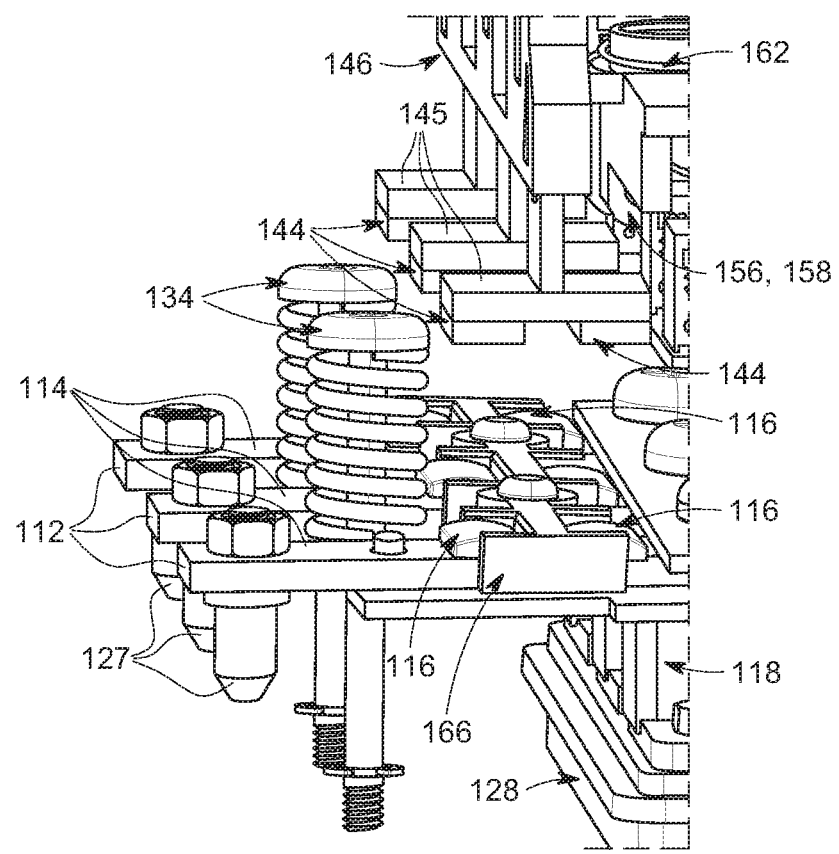
FIG. 13 is a perspective view of a portion of the contact assembly of the SSCB depicted in FIGS. 1A, 1B and 2, highlighting, among other things, the air gap that is present when the SSCB's air gap assembly is disengaged, and the presence and positioning of an electrically nonconductive plastic barrier that aids in both minimizing arcing across the SSCB's air gap during times the SSCB's air gap is being opened and the overall size and footprint of the SSCB.

The barrier 166, which is shown to be present in the exemplary embodiment of the SSCB 100 described and depicted above (see, for example, "barrier 166" in FIGS. 1A an 1B), is a more effective galvanic isolator than is air, so, for a given current the width of the gap 164 needed to provide galvanic isolation (no possibility of arcing across the gap 164) is smaller than if the barrier 166 was not present. The smaller gap 164 is desirable since it helps minimize the overall size and footprint of the SSCB 100. Note that when barrier 166 is present, gap 164 is not, of course, occupied by air. Nevertheless, an air gap is still formed between the copper bus 114 and input terminals to the FET power module 118 during times the air gap assembly 106 is disengaged (holster 146 in the 'up' position). In particular, as can be better seen in the close-up drawing presented in FIG. 13, an air gap is still present in the volume of space above the barrier 166 and laterally around the barrier's 166's external sides. These air gap paths are longer than the width of gap 164. Consequently, for a gap 164 of a given width, using the barrier 166 effectively increases the width of the air gap formed between the copper bus 114 and line-side inputs to the FET power module 118 when the air gap assembly 106 is disengaged.

Figure 14:
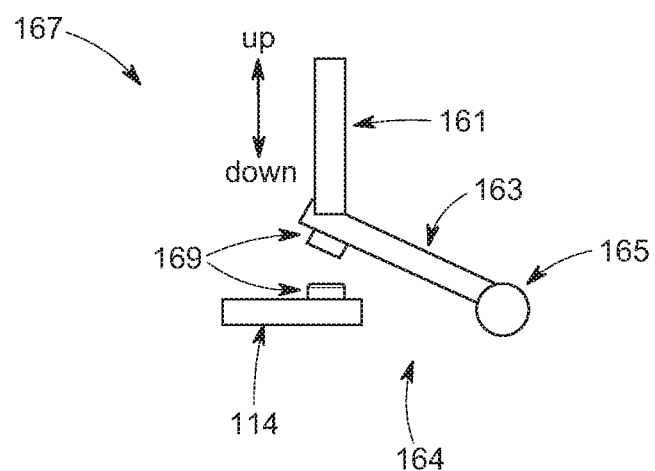
FIG. 14 is a drawing depicting a single-point type connector that can be used in the SSCB to open/close the SSCB's air gap, instead of the bridge-type connector used in the exemplary embodiment of the SSCB depicted in FIGS. 1A, 1B and 2.

The bridge-type connector 144/145 is just one of various approaches that can be used to bridge gap 164. In another embodiment of the invention a single-point type connector 167 like that depicted in FIG. 14 is used. Rather, rather than forming a conductive bridge 145 across gap 164, hold/release member 161 pushes arm 163 down, rotating it about hinge 165 to close single-point contacts 169. Because there is only a single point of contact point, instead of the two required for each bridge-type connector 144/145, just half the force is required to hold and maintain the contacts 169 down in the closed (engaged) position. Note that in one embodiment of the invention the bottom end of hold/release member 161 is permanently attached to the distal end of arm 163 and disconnect spring(s) is/are used to pull hold/release member 161 up, similar to how disconnect springs 162 pull up holster 146 in the bridge-type connector approach described above. In another embodiment of the invention hold/release member 161 is not permanently attached to arm 163 but simply pushes against arm 163 when the air gap assembly 106 is engaged. According to this alternative approach, a spring or other actuating member is configured beneath arm 163 to push contacts 169 open during the air gap assembly 106 disengagement process and thereby establish galvanic isolation between line-in and line-out terminals 112 and 124.

After the air gap assembly 106 has been disengaged (holster 146 in 'up' position), it can be reengaged (holster 146 in the 'down' position) by pressing RESET button 168, which, as can be seen in FIG. 1B, extends from the interior of the SSCB 100 through front faceplate 102. Pressing RESET button 168 forces bridge contacts 144 on the distal end of holster 146 to come in physical and electrical contact with mating bridge contacts 116 below, thus removing the air gap and reestablishing an electrically conductive path between line-in and line-out terminals 112 and 124. As the RESET button 168 is pressed into the enclosure it engages holster 146 and recompresses disconnect springs 162. It also engages rotating latch 156, which responds by rotating about pivot 158 to engage top lip 170 of holster 146 once again. (See FIGS. 1A and 9A, which show the air gap assembly 106 in the 'engaged' position and FIG. 10, which shows the rotating latch 156 in the 'latched' position.) It should be mentioned that during a short circuit or unacceptable overload, rotating latch 156 is configured so that it engages pawl 151. When engaged, holster 146 cannot be forced back down to reengage the air gap assembly contacts during the time the short circuit or unacceptable overload is present, even if the RESET button 168 is pressed and held down. This feature prevents a person from attempting to operate the SSCB 100 beyond its capabilities, thus making the SSCB 100 a "trip free" circuit breaker.

Whenever the SSCB 100 detects a short circuit, solenoid 152 automatically triggers air gap assembly 106 to disengage and provide galvanic isolation between the SSCB's 100's line-in and line-out terminals 112 and 124. In one embodiment of the invention air gap assembly 106 can also be disengaged manually (by a person), specifically, by pressing RELEASE button 172 (see FIGS. 1A-B and 2). When RELEASE button 172 is pressed, linking member 174 pushes against a cammed surface 155 on rotating latch 156, causing rotating latch 156 to rotate about pivot 158 but in the opposite rotational direction it rotates when RESETTING ('engaging') the air gap assembly 106. This causes rotating latch 156 to release (disengage) from top lip 170 of holster 146 and allow disconnect spring 162 to decompress and lift holster 146 up to form the air gap (the state of the SSCB 100 depicted in FIGS. 1B, 11, and 12). As holster 146 lifts up, it also pushes against and lifts RESET button 168, to expose lockout-tagout (LOTO) hole 175, through which a service or maintenance (service/maintenance) worker can insert a padlock or other locking device to complete LOTO safety procedure. (Note that RESET button 168 will pop up to reveal LOTO hole 175 whether the air gap assembly 106 is automatically disengaged (by action of the solenoid 152) or manually (by a person pressing the RELEASE button 172).) Completing the LOTO safety procedure ensures that the service/maintenance worker or other person will not inadvertently or accidentally reengage the air gap assembly 106. After service/maintenance has been completed, the service/maintenance worker can then remove the padlock or other locking device and reengage the air gap assembly 106 by pushing RESET button 168 back into the SSCB enclosure.

Before the air gap assembly 106 is manually disengaged, it is preferable to first turn the MOSFETs 138 in the FET power module 118 OFF, so that arcing does not occur across gap 164. To make this happen, in one embodiment of the invention RELEASE button 172 is equipped with a microswitch (not shown in the drawing) that opens and closes depending on the physical position of RELEASE button 172. The microswitch is in electrical communication with the microcontroller 148 on the control board 104, to thereby allow microcontroller 148 to monitor the microswitch's status (open or closed). So long as the RELEASE button 172 is in its natural state (not pushed), the microswitch remains closed. However, as soon as the RELEASE button 172 is pressed, the microswitch opens, and when the microcontroller 148 detects that the microswitch has opened it immediately responds by directing the drivers on the driver board 108 to switch the MOSFETs 138 in the FET power module 118 OFF. The MOSFETs 138 are switched OFF very quickly in this process, well before the air gap assembly 106 is able to disengage the holster's bridge contacts 144 from corresponding contacts 116. In this way, arcing across gap 164 is avoided. Note that in a preferred embodiment of the SSCB 100, two tactile mechanical switches 153 (two for redundancy) are used (see FIG. 2).

Figure 15:
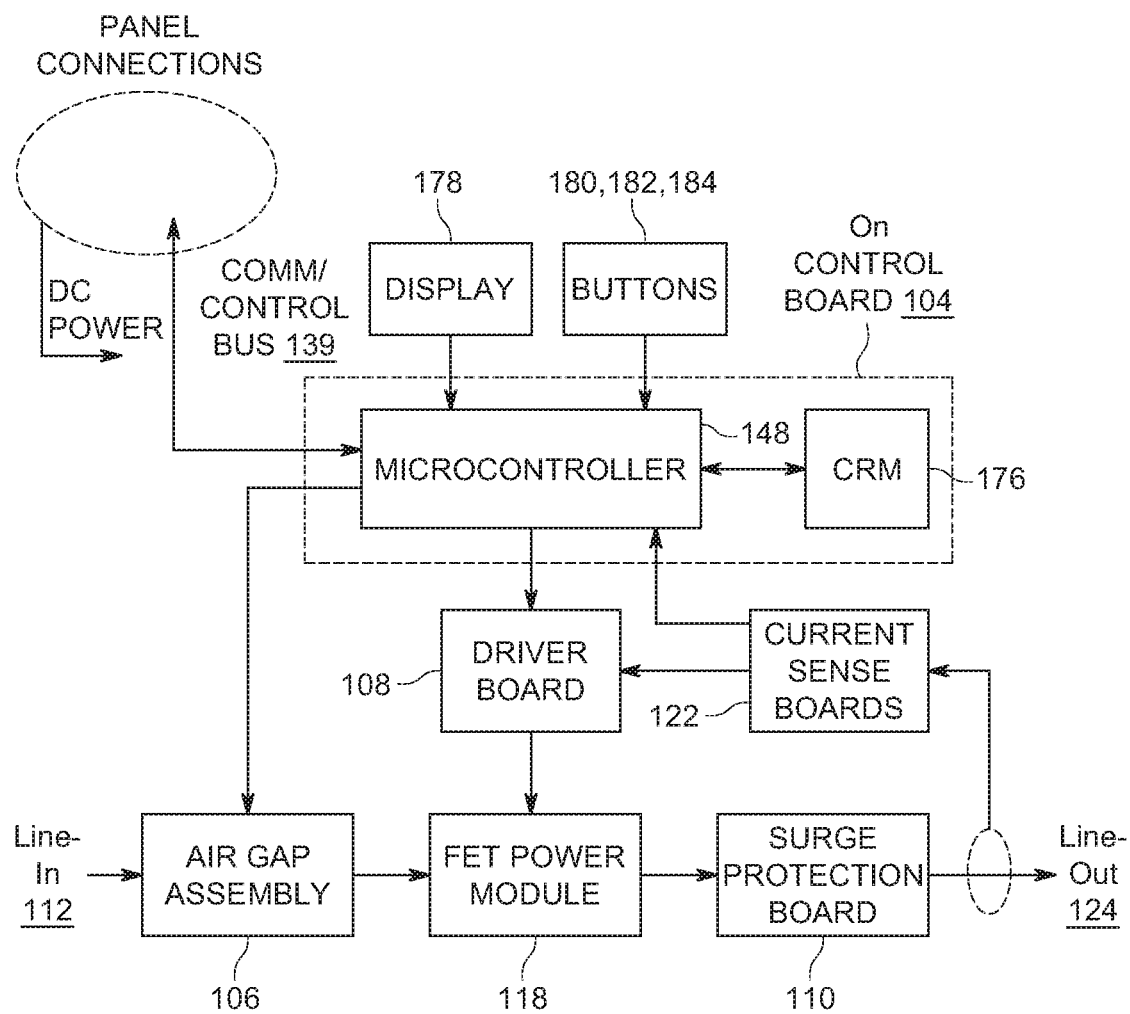
FIG. 15 is a simplified block diagram of the SSCB depicted in FIGS. 1A, 1B and 2, highlighting the SSCB's control board, including its microcontroller, and the microcontroller's relationship with other components of the SSCB.

The control board 104 serves as the 'brains' of the SSCB 100 and performs a variety of functions, beyond just detecting whether the microswitch on the RELEASE button 172 is open or closed. The central and most important component on the control board 104 is the microcontroller 148. FIG. 15 is a simplified block diagram of the SSCB 100, highlighting the control board's 104's and microcontroller's 148's relationship with other components of the SSCB 100. In addition to the microcontroller 148, control board 104 includes non-transitory computer readable medium (CRM) 176 comprising flash memory and/or electrically erasable read only memory (EPROM) for storing firmware that directs the microcontroller's 148's operation, as well as random access memory (RAM) the microcontroller 148 uses in executing the firmware instructions. The non-transitory CRM 176 may be external to the microcontroller 148 (as depicted in FIG. 15), embedded in the microcontroller 148, or may comprise non-transitory CRM that is partly embedded in the microcontroller 148 and partly external to the microcontroller 148. CRM 176 is configured to store computer program instructions that direct the general operation of the microcontroller 148; instructions that direct if, how, and when the microcontroller 148 interacts with other electrical components in the SSCB 100; and instructions and protocol that allow it to communicate with, and to be controlled by, other devices (e.g., an external computer) via comm/control bus 139. In one embodiment of the invention the computer program instructions further include instructions that direct how the microcontroller 148 responds to current measurement information received from current sense boards 122 and, in particular, instructions that direct how it and a display driver on control board 104 operate to display non-real-time and real-time information (e.g., real-time line current being drawn by an attached load and/or trip status (ON, OFF, or STANDBY)) on an electronic display 178. As can be best seen in FIG. 5, electronic display 178 is mounted in a first cutout formed through front faceplate 102. Preferably, electronic display 178 is an electronic ink display, which is a display technology that allows information currently being displayed to continue to be displayed even if electrical power to the display is disrupted or completely removed. Front faceplate 102 further includes second, third, and fourth cutouts for ON/OFF/STANDBY buttons 180, 182, and 184. (Note that ribbon cable 186 provides the electrical connectivity between the control board 104 and ON/OFF/STANDBY buttons 180, 182, and 184.)

In one embodiment of the invention the ON/OFF/STANDBY buttons 180, 182, and 184 are translucent and colored green, red, and yellow, respectively, and light-emitting diodes (LEDs) (not shown in the drawings) are configured beneath each button. Whichever LED is illuminated thus indicates and emphasizes the present state of the SSCB 100. Specifically, when the ON button 180 (the green colored button with the "I" indicator) is pressed ON and its underlying LED is illuminated, the green emphasis indicates that the SSCB 100 is in a fully operational state (MOSFETs 138 in FET power module 118 ON and air gap assembly 106 engaged, as depicted in FIG. 9A). When the STANDBY button 184 (yellow button marked with an "X") is pressed and its underlying LED is illuminated, the yellow emphasis indicates that the SSCB 100 is in a standby state (air gap assembly 106 engaged but MOSFETs 138 in FET power module 118 OFF, as depicted in FIG. 9C). (Note that a transition from the STANDBY state to the ON state, can then be made, if desired, by simply pushing the ON (green) button 180.) Finally, the OFF red button 182, which is not actually a pressable button in the exemplary embodiment of the SSCB 100 described here (but could be in an alternative design) is illuminated by its underlying LED when both the air gap assembly 106 is disengaged and the MOSFETs 138 in FET power module 118 are OFF (see FIG. 9B). The red emphasis indicates that the SSCB 100 is in a 'tripped,' i.e., fully OFF state (MOSFETs 138 in FET power module 118 OFF and air gap assembly 106 disengaged). The reason that the OFF red button 182 does not need to be a pressable button is that that functionality is already provided by RELEASE button 172, which as explained above, when pressed causes the SSCB's electronics and driver circuitry to switch the MOSFET's 138 in FET power module 118 OFF and soon thereafter trigger the air gap assembly 106 to disengage and raise harness 146 so that galvanic isolation is present between the SSCB's line-in and line-out terminals 112 and 124.

The barrier 166, S-bends 120, and rotating latch 156 all help to minimize the overall footprint and volume of space occupied by the SSCB 100, which is especially important since the SSCB 100 is usually (though not always) installed in a panelboard, inside which space is often very limited. To further minimize the overall size and footprint of the SSCB 100, in one embodiment of the invention all of the various components of the SSCB 100 are constructed into just a few compact subassemblies, which can then be assembled in a few simple and repeatable steps. In one particular embodiment the SSCB 100 comprises just three subassemblies (see FIG. 16): 1) front faceplate assembly 192, 2) air gap subassembly 194, and 3) FET subassembly 196. Air gap subassembly 194 comprises solenoid 152, charged capacitor 150, holster 146, bridge contacts 144, conductive bridges 145, rotating latch 156, RESET button 168, and RELEASE button 172. FET subassembly 196 comprises driver board 108, surge protection board 110, line-in terminals 112, copper bus 114, barrier 166, FET power module 118, S-bends 120 with attached current sense boards 122, and thermally conductive heat spreader 128. Finally, front faceplate assembly 192 comprises control board 104 and faceplate 102 with ON/OFF/STANDBY buttons 180, 182, 184. Edges of air gap subassembly 194 slide into grooves/slots 198 formed in line-in and line out enclosure pieces 200 and 202, and line-in and line out enclosure pieces 200 and 202 are secured together using screws (not shown). The front faceplate assembly 192 is then attached to line-in and line-out enclosure pieces 200 and 202 (again, using screws). The thermally conductive heat spreader 128 serves as a back enclosure and, as explained in detail above, serves the dual purpose of a heatspreader and a mounting means for attaching the SSCB 100 to a panelboard heatsink.

While various embodiments of the present invention have been described, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments but, instead, should be determined by the appended claims, including the full scope of equivalents to which such claims are entitled.

The invention claimed is:
1. A solid-state circuit breaker (SSCB), comprising:
an electrical bus including line-side and load-side terminals;
an air gap and solid-state device connected in series between the line-side and load-side terminals;
a contact holder with one or more movable contacts;
an air gap assembly having a rotating latch mechanism configured to engage the contact holder and force the one or more movable contacts to remain in physical and electrical contact with one or more matching stationary contacts on the electrical bus during times the SSCB is in an untripped state, and thereby close the air gap between the line-side and load-side terminals; and a controller configured to trigger the air gap assembly upon the SSCB detecting a short circuit or persistent and undesirable overload, and cause the rotating latch mechanism to automatically disengage from the contact holder so that the one or more movable contacts are no longer forced to remain in physical and electrical contact with the one or more stationary contacts and the air gap between the line-side and load-side terminals is opened.

2. The SSCB of claim 1, further comprising current monitoring and detection circuitry, separate from the controller, configured to monitor current flowing in a load circuit attached to the load-side terminals, and, upon detecting a short circuit or impending short circuit in the load circuit, generate a control signal that switches the solid-state device OFF before the air gap assembly completes opening the air gap after being triggered by the controller.

3. The SSCB of claim 1, wherein the one or more movable contacts comprises one or more conductive bridges that bridge the air gap during times the SSCB is in the untripped state and the rotating latch mechanism is engaging the contact holder and forcing the one or more movable contacts to remain in physical and electrical contact with the one or more matching stationary contacts.

4. The SSCB of claim 1, wherein the one or more movable contacts comprises one or more single-point type connectors.

5. The SSCB of claim 1, further comprising a RELEASE button mechanically linked to the air gap assembly, which, when pressed, causes the rotating latch mechanism to manually disengage from the contact holder and allow the movable contacts to physically and electrically separate from the one or more stationary contacts and thereby open the air gap.

6. The SSCB of claim 5, further comprising a RESET button mechanically linked to the air gap assembly and operable to reset the SSCB to the untripped state after the SSCB has tripped, wherein, when pressed, the RESET button causes the rotating latch mechanism to rotate, reengage the contact holder, and force the one or more movable contacts to return to physical and electrical contact with the one or more stationary contacts.

7. The SSCB of claim 6, wherein the RESET button is configured to pop out of an enclosure that houses the SSCB, both upon the controller triggering the air gap assembly to automatically open the air gap and upon the RELEASE button being pressed to manually open the air gap, and wherein the RESET button includes a lockout-tagout (LOTO) hole that is exposed once the RESET button has popped out of the enclosure.

8. The SSCB of claim 7, wherein the air gap assembly is configured to prevent the RESET button from being pressed into the enclosure to reset the SSCB, if a short circuit or unacceptable overload is present in the load circuit or an attempt is made to operate the SSCB outside its intended or specified operating capability.

9. The SSCB of claim 1, wherein the electrical bus includes one or more bends that help minimize a volume or footprint of the SSCB.

10. The SSCB of claim 1, further comprising a thermally conductive heat spreader in thermal contact with the solid-state device that serves as both a wall for the SSCB and a mounting plate for mounting the SSCB to a heatsink in an electrical distribution panel.

11. The SSCB of claim 10, wherein the line-side and load-side terminals are equipped with electrically conductive press-fit mounting pins configured to insert into matching pin-mount receptacles in a busbar of the electrical distribution panel.

12. The SSCB of claim 1, wherein the SSCB is configurable in:
an OFF state in which the solid-state device is OFF and the air gap is open;
an ON state in which the solid-state device is ON and the air gap is closed; and
a STANDBY state in which the solid-state device is OFF and the air gap is closed.

13. The SSCB of claim 12, wherein the SSCB is enclosed in a housing having a front faceplate that reveals indicators or buttons that indicate at any given time whether the SSCB is in the OFF state, the ON state, or the STANDBY state.

14. The SSCB of claim 13, wherein the front faceplate further includes an opening for a display that is operable to continue displaying information even after electrical power to the display has been disrupted or completely removed.

15. A solid-state circuit breaker (SSCB), comprising:
an electrical bus including line-side terminals equipped with electrically conductive press-fit mounting pins configured to insert into matching pin-mount receptacles in a busbar of an electrical distribution panel and load-side terminals;
an air gap and solid-state device connected in series between the line-side and load-side terminals;
one or more movable conductive bridges;
an air gap assembly configured to force the one or more movable conductive bridges to bridge the air gap, during times the SSCB is in an untripped state, and thereby maintain an electric current path between the line-side and load-side terminals; and
a controller configured to trigger the air gap assembly and stop the one or more conductive bridges from bridging the air gap, upon the SSCB detecting a short circuit or persistent and undesirable overload of in a load circuit attached to the load-side terminals; and
a thermally conductive heat spreader in thermal contact with the solid-state device that serves as both a wall for the SSCB and a mounting plate for mounting the SSCB to a heatsink in the electrical distribution panel.

16. The SSCB of claim 15, further comprising current monitoring and detection circuitry, separate from the controller, configured to monitor current flowing in the load circuit, and, upon detecting a short circuit or impending short circuit in the load circuit, generate a disable signal that switches the solid-state device OFF, before the air gap assembly completes stopping the one or more conductive bridges from bridging the air gap after being triggered by the controller.

17. The SSCB of claim 15, further comprising a RELEASE button mechanically linked to the air gap assembly, which, when pressed, causes the air gap assembly to manually stop the one or more conductive bridges from bridging the air gap and without requiring the air gap assembly to be triggered by the controller.

18. The SSCB of claim 17, further comprising a RESET button mechanically linked to the air gap assembly operable to reset the SSCB to the untripped state after the SSCB has tripped, wherein, when pressed, the RESET button causes the air gap assembly to force the one or more movable conductive bridges to once again bridge the air gap.

19. The SSCB of claim 18, wherein the RESET button is configured to pop out of an enclosure that houses the SSCB, both upon the controller triggering the air gap assembly and upon the RELEASE button being pressed to manually stop the one or more conductive bridges from bridging the air gap, and wherein the RESET button includes a lockout-tagout (LOTO) hole that is exposed once the RESET button has popped out of the enclosure.

20. The SSCB of claim 15, wherein the electrical bus includes one or more bends that help minimize a volume or footprint of the SSCB.

21. The SSCB of claim 15, wherein the SSCB is configurable in:
an OFF state in which the solid-state device is OFF and the air gap is open;
an ON state in which the solid-state device is ON and the air gap is closed; and
a STANDBY state in which the solid-state device is OFF and the air gap is closed.

22. The SSCB of claim 21, wherein the SSCB is enclosed in a housing having a front faceplate that reveals indicators or buttons that indicate at any given time whether the SSCB is in the OFF state, the ON state, or the STANDBY state.

23. The SSCB of claim 22, wherein the front faceplate further includes an opening for a display that is operable to continue displaying information even after electrical power to the display has been disrupted or completely removed.

24. A solid-state circuit breaker (SSCB), comprising:
an electrical bus including line-side and load-side terminals;
an air gap and solid-state device connected in series between the line-side and load-side terminals;
an air gap assembly that controls whether the air gap is open or closed, and that automatically opens the air gap upon a short circuit or persistent and undesirable overload occurring in a load circuit attached to the load-side terminals; and
a driver circuit that switches the solid-state device OFF upon a short circuit or persistent and undesirable overload occurring in the load circuit,
wherein the air gap assembly and driver circuit are operable to configure the SSCB to operate in one of three possible operating states at any given time: an OFF state during which the solid-state device is switched OFF and the air gap is open, an ON state during which the solid-state device is switched ON and the air gap is closed, and a STANDBY during which the solid-state device is switched OFF and the air gap is closed.

25. The SSCB of claim 24, wherein the air-gap assembly comprises a contact holder for holding one or more movable contacts and a rotating latch mechanism configured to engage the contact holder and force the one or more movable contacts to remain in physical and electrical contact with one or more matching stationary contacts on the electrical bus, during times the SSCB is in an untripped state, and thereby close the air gap between the line-side and load-side terminals.

26. The SSCB of claim 25, wherein the one or more movable contacts comprises one or more conductive bridges.

27. The SSCB of claim 25, wherein the one or more movable contacts comprises one or more single-point type connectors.

28. The SSCB of claim 24, wherein the driver circuit is configured to switch the solid-state device OFF before the air gap assembly completes opening the air gap, when the air gap assembly and driver circuit are transitioning the SSCB from the ON state to the OFF state.

29. The SSCB of claim 24, further comprising a RELEASE button mechanically linked to the air gap assembly, which, when pressed, causes the air gap assembly to manually open the air gap.

30. The SSCB of claim 29, further comprising a RESET button, which, when pressed while the SSCB is in the OFF state, mechanically reengages the air gap assembly and closes the air gap.

31. The SSCB of claim 30, wherein the RESET button is configured to pop out of an enclosure that houses the SSCB, both upon the air gap assembly automatically opening the air gap and upon the RELEASE button being pressed to manually open the air gap.

32. The SSCB of claim 31, wherein the air gap assembly is configured to prevent the RESET button from being pressed into the enclosure, if a short circuit or persistent and undesirable overload is present in the load circuit or an attempt is made to operate the SSCB outside its intended or specified operating capability.

33. The SSCB of claim 24, wherein the electrical bus includes one or more bends that help minimize a volume or footprint of the SSCB.

34. The SSCB of claim 24, further comprising a thermally conductive heat spreader in thermal contact with the solid-state device that serves as both a wall for the SSCB and a mounting plate for mounting to a heatsink in an electrical distribution panel.

35. The SSCB of claim 24, wherein the SSCB is enclosed in a housing having a front faceplate that reveals indicators that indicate whether the SSCB, at any given time, is in the OFF state, the ON state, or the STANDBY state.

36. The SSCB of claim 35, further comprising an OFF button or switch that is accessible from the front faceplate and that when pressed or switched causes the air gap assembly and driver circuit to transition the SSCB in the OFF state.

37. The SSCB of claim 36, further comprising a STANDBY button or switch that is accessible from the front faceplate and that when pressed or switched causes the air gap assembly and driver circuit to transition the SSCB to the STANDBY state.

38. The SSCB of claim 37, wherein the front faceplate further includes an opening for a display that is operable to continue displaying information even after electrical power to the display has been disrupted or completely removed.

* * * * *